US012660535B2

(12) United States Patent
Son et al.

(10) Patent No.: US 12,660,535 B2
(45) Date of Patent: Jun. 16, 2026

(54) SUBSTRATE TREATING APPARATUS AND SUBSTRATE TREATING METHOD

(71) Applicant: SEMES CO., LTD., Cheonan-si (KR)

(72) Inventors: Won Sik Son, Yongin-si (KR); Hyun Yoon, Hwaseong-si (KR); Hyo Won Yang, Seoul (KR); Ji Hoon Jeong, Hwaseong-si (KR); Young Dae Chung, Incheon (KR); In Ki Jung, Hwaseong-si (KR)

(73) Assignee: Semes Co., LTD, Cheonan-si (KR)

( * ) Notice: Subject to any disclaimer, the term of this patent is extended or adjusted under 35 U.S.C. 154(b) by 670 days.

(21) Appl. No.: 18/057,321

(22) Filed: Nov. 21, 2022

(65) Prior Publication Data

US 2023/0207324 A1    Jun. 29, 2023

(30) Foreign Application Priority Data

Dec. 28, 2021    (KR) ........................ 10-2021-0189896

(51) Int. Cl.
*H10P 34/42* (2026.01)
*H10P 72/00* (2026.01)

(52) U.S. Cl.
CPC .......... *H10P 34/42* (2026.01); *H10P 72/0411* (2026.01); *H10P 72/0436* (2026.01)

(58) Field of Classification Search
CPC ............... H01L 21/268; H01L 21/6704; H01L 21/67115; H01L 21/67051; H01L 21/67063; H01L 21/6708; G03F 7/70691; G03F 7/70625; G03F 1/80; G03F 1/44; B23K 26/073
See application file for complete search history.

(56) References Cited

U.S. PATENT DOCUMENTS

| | | | | |
|---|---|---|---|---|
| 2011/0244626 A1* | 10/2011 | Huang | ................. | H10F 77/211 |
| | | | | 257/E31.124 |
| 2020/0035517 A1* | 1/2020 | Hidaka | ............. | H01L 21/67051 |
| 2021/0202280 A1* | 7/2021 | Kim | ................. | H01L 21/68764 |
| 2021/0278771 A1* | 9/2021 | Lo | ...................... | G03F 7/70633 |
| 2023/0067973 A1* | 3/2023 | Kim | ................. | H01L 21/67742 |
| 2023/0084076 A1* | 3/2023 | Yoon | ................. | H01L 21/67115 |
| | | | | 430/5 |
| 2023/0152706 A1* | 5/2023 | Choi | ................. | H01L 21/67051 |
| | | | | 355/67 |

(Continued)

FOREIGN PATENT DOCUMENTS

| | | |
|---|---|---|
| JP | 2005-305339 A | 11/2005 |
| JP | 4015849 B2 | 11/2007 |

(Continued)

*Primary Examiner* — Yasser A Abdelaziez
(74) *Attorney, Agent, or Firm* — Harness, Dickey & Pierce P.L.C.

(57) ABSTRACT

The present invention provides a substrate treating method of treating a substrate including a plurality of cells, the substrate treating method including: a liquid treating operation of supplying a treatment liquid to the substrate; and a heating operation of heating the substrate by supplying the treatment liquid and irradiating laser light to a specific region located outside a region in which the plurality of cells is provided, in which the laser light is formed to cover the specific region when viewed from the top.

6 Claims, 19 Drawing Sheets

(56)                    References Cited

U.S. PATENT DOCUMENTS

2023/0185206 A1 *  6/2023  Kim .................... G03F 7/70875
                                                         156/345.19
2023/0204414 A1 *  6/2023  Yoon .................... G01J 1/0271
                                                         356/218
2023/0205100 A1 *  6/2023  Son .................... H01L 21/6708
                                                         355/30

FOREIGN PATENT DOCUMENTS

JP              4809632  B2    11/2011
KR     10-2019-0037379  A      4/2019
KR     10-2020-0088794  A      7/2020

* cited by examiner

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2021-0189896 filed in the Korean Intellectual Property Office on Dec. 28, 2021, the entire contents of which are incorporated herein by reference.

TECHNICAL FIELD

The present invention relates to a substrate treating apparatus and a substrate treating method, and more particularly, to a substrate treating apparatus and a substrate treating method, which treat a substrate by heating the substrate.

BACKGROUND ART

A photography process for forming a pattern on a wafer includes an exposure process. The exposure process is a preliminary operation for scraping a semiconductor integrated material adhered on the wafer into a desired pattern. The exposure process may have various purposes, such as forming a pattern for etching and forming a pattern for ion implantation. In the exposure process, a pattern is drawn with light on the wafer by using a mask, which is a kind of 'frame'. When the semiconductor integrated material on a wafer, for example, a resist on the wafer, is exposed to light, chemical properties of the resist are changed according to a pattern by the light and the mask. When a developer is supplied to the resist whose chemical properties are changed according to the pattern, a pattern is formed on the wafer.

In order to precisely perform the exposure process, the pattern formed on the mask needs to be precisely manufactured. Whether the pattern is formed satisfactorily under the required process conditions needs to be checked. A large number of patterns are formed on one mask. Accordingly, it takes a lot of time for an operator to inspect all of a large number of patterns in order to inspect one mask. Accordingly, a monitoring pattern that may represent one pattern group including a plurality of patterns is formed on the mask. In addition, an anchor pattern that may represent a plurality of pattern groups is formed on the mask. The operator may estimate the quality of the patterns included in one pattern group through the inspection of the monitoring pattern. In addition, the operator may estimate the quality of the patterns formed on the mask through the inspection of the anchor pattern.

In addition, in order to increase the inspection accuracy of the mask, it is preferable that the critical dimensions of the monitoring pattern and the anchor pattern are the same. A critical dimension correction process for precisely correcting the line widths of the patterns formed on the mask is additionally performed.

FIG. 1 shows a normal distribution with respect to a first critical dimension CDP1 of a monitoring pattern and a second critical dimension CDP2 of an anchor pattern of a mask before a critical dimension correction process is performed during a mask manufacturing process. In addition, the first critical dimension CDP1 and the second critical dimension CDP2 have sizes smaller than a target critical dimension. Before the critical dimension correction process is performed, there is a deliberate deviation in the Critical Dimensions (CDs) of the monitoring pattern and the anchor pattern. Then, by additionally etching the anchor pattern in the critical dimension correction process, the critical dimensions of the two patterns are made the same. When the anchor pattern is over-etched than the monitoring pattern in the process of additionally etching the anchor pattern, the critical dimension of the patterns formed on the mask cannot be precisely corrected due to the difference in the critical dimension between the monitoring pattern and the anchor pattern. When the anchor pattern is additionally etched, precise etching of the anchor pattern needs to be accompanied.

In the process of etching the anchor pattern, a treatment liquid is supplied to the wafer, and the anchor pattern formed on the wafer to which the treatment liquid is supplied is heated by using laser light. In order to accompany precise etching of the anchor pattern, laser light needs to be precisely irradiated to a specific region where the anchor pattern is formed. When an error occurs in the irradiation position, which is the reference point for irradiating laser light on the upper part of the anchor pattern, the anchor pattern cannot be etched smoothly.

When laser light is irradiated to a monitoring pattern or/and an exposure pattern other than the anchor pattern, the difference in critical dimension between the anchor pattern and the monitoring pattern further increases. The anchor pattern may include a plurality of patterns. When laser light is irradiated to only some of the plurality of patterns included in the anchor pattern, other patterns among the plurality of patterns included in the anchor pattern need be irradiated with laser light again. In this case, it is difficult to match the etch uniformity of the plurality of patterns included in the anchor pattern.

SUMMARY OF THE INVENTION

The present invention has been made in an effort to provide a substrate treating apparatus and method capable of performing precise etching on a substrate.

The present invention has also been made in an effort to provide a substrate treating apparatus and method capable of performing selective etching on a specific region of a substrate.

The present invention has also been made in an effort to provide a substrate treating apparatus and method capable of uniformly etching a specific region of a substrate.

The present invention has also been made in an effort to provide a substrate treating apparatus and method capable of collectively etching a pattern formed on a specific region of a substrate.

The present invention has also been made in an effort to provide a substrate treating apparatus and method capable of precisely etching a pattern formed in a specific region of a substrate even when laser light is irradiated to a position deviated from an irradiation position of an upper portion of the specific region of the substrate.

The problem to be solved by the present invention is not limited to the above-mentioned problems, and the problems not mentioned will be clearly understood by those skilled in the art from the present specification and the accompanying drawings.

An exemplary embodiment of the present invention provides a substrate treating method of treating a substrate including a plurality of cells, the substrate treating method including: a liquid treating operation of supplying a treatment liquid to the substrate; and a heating operation of heating the substrate by supplying the treatment liquid and irradiating laser light to a specific region located outside a region in which the plurality of cells is provided, in which the laser light is formed to cover the specific region when viewed from the top.

According to the exemplary embodiment, a first pattern and a second pattern different from the first pattern may be formed on the substrate, the first pattern may be formed in the plurality of cells, and one or more second patterns may be formed within the specific region.

According to the exemplary embodiment, the laser light may be provided in a flat-top.

According to the exemplary embodiment, a maximum radius of the laser light may be calculated with the shortest distance among distances from edges of the cells located adjacent to the specific region among the plurality of cells to a center of the second patterns.

According to the exemplary embodiment, a minimum radius of the laser light may be calculated with a maximum distance among distances between the center of the second patterns to corners of the second patterns.

According to the exemplary embodiment, a radius of the laser light irradiated to the second pattern may be determined with a value obtained by subtracting an allowable error distance from the maximum radius, and the allowable error distance may be determined with a half of a value obtained by subtracting the minimum radius from the maximum radius.

According to the exemplary embodiment, a center of the laser light irradiated to the second pattern may be movable from the center of the second pattern to the allowable error distance.

According to the exemplary embodiment, the second pattern may be provided in plurality within the specific region, and the plurality of second patterns may be formed in a combination of a serial arrangement and/or a parallel arrangement.

Another exemplary embodiment of the present invention provides an irradiation method of irradiating laser light to a mask including a plurality of cells, and having a first pattern formed in the plurality of cells, and a second pattern formed in a specific region located outside regions in which the cells are provided, in which the laser light is irradiated to the specific region to heat the second pattern, and is formed to cover the specific region when viewed from the top.

According to the exemplary embodiment, the laser light may be circular when viewed from the top.

According to the exemplary embodiment, one or more second patterns may be formed within the specific region, and a maximum radius of the laser light may be calculated with the shortest distance among distances from edges of the cells located adjacent to the specific region among the plurality of cells to a center of the second patterns.

According to the exemplary embodiment, a minimum radius of the laser light may be calculated with a maximum distance among distances between the center of the second patterns and corners of the second patterns.

According to the exemplary embodiment, a radius of the laser light irradiated to the second pattern may be determined with a value obtained by subtracting an allowable error distance from the maximum radius, the allowable error distance may be determined with a half of a value obtained by subtracting the minimum radius from the maximum radius, and a center of the laser light irradiated to the second pattern may be movable from the center of the plurality of second patterns to the allowable error distance.

According to the exemplary embodiment, the second pattern may be provided in plurality within the specific region, and the plurality of second patterns may be formed in a combination of a serial arrangement and/or a parallel arrangement.

Still another exemplary embodiment of the present invention provides a substrate treating apparatus, including: a housing having a treatment space; a support unit for supporting and rotating a substrate including a plurality of cells in the treatment space; a liquid supply unit for supplying a liquid to the substrate supported by the support unit; and an irradiating module for irradiating laser light to a specific region located outside a region in which the plurality of cells is provided in the substrate supported by the support unit, in which the laser light is provided in a flat-top, and is formed to cover the specific region when viewed from the top.

According to the exemplary embodiment, a first pattern and a second pattern different from the first pattern may be formed on the substrate, the first pattern may be formed in the plurality of cells, and the second pattern may be formed in the specific region, the second pattern may be provided in plurality within the specific region, and the plurality of second patterns may be formed in a combination of a serial arrangement and/or a parallel arrangement.

According to the exemplary embodiment, a maximum radius of the laser light may be calculated with the shortest distance among distances from edges of the cells located adjacent to the specific region among the plurality of cells to a center of the plurality of second patterns.

According to the exemplary embodiment, a minimum radius of the laser light may be calculated with a maximum distance among distances between the center of the plurality of second patterns and corners of the plurality of second patterns.

According to the exemplary embodiment, a radius of the laser light irradiated to the second pattern may be determined with a value obtained by subtracting an allowable error distance from the maximum radius, and the allowable error distance may be determined with a half of a value obtained by subtracting the minimum radius from the maximum radius.

According to the exemplary embodiment, a center of the laser light irradiated to the second pattern may be movable from the center of the plurality of second patterns to the allowable error distance.

According to the exemplary embodiment of the present invention, it is possible to perform precise etching on a substrate.

Further, according to the exemplary embodiment of the present invention, it is possible to perform selective etching on a specific region of a substrate.

Further, according to the exemplary embodiment of the present invention, it is possible to perform uniform etching on a specific region of a substrate.

Further, according to the exemplary embodiment of the present invention, it is possible to collectively etch a pattern formed on a specific region of a substrate.

Further, according to the exemplary embodiment of the present invention, it is possible to precisely etch a pattern formed in a specific region of a substrate even when laser light is irradiated to a position deviated from an irradiation position of an upper portion of the specific region of the substrate.

The effect of the present invention is not limited to the foregoing effects, and those skilled in the art may clearly understand non-mentioned effects from the present specification and the accompanying drawings.

DETAILED DESCRIPTION

Figure 1:
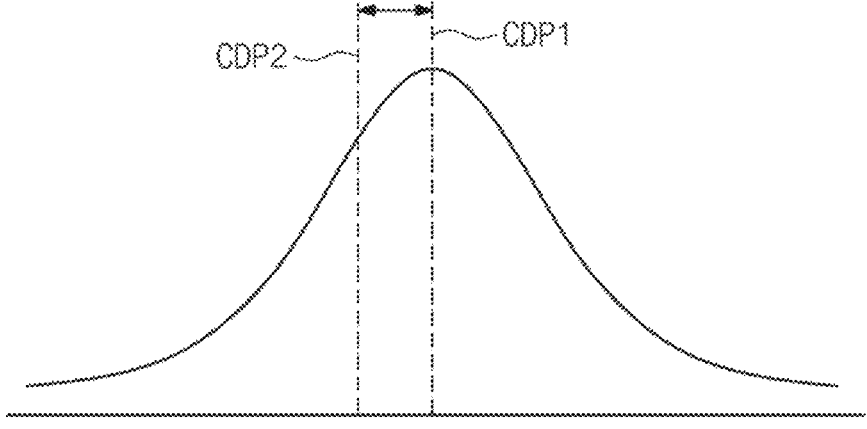
FIG. 1 is a diagram illustrating a normal distribution with respect to a critical dimension of a monitoring pattern and a critical dimension of an anchor pattern.

Hereinafter, an exemplary embodiment of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

Figure 2:
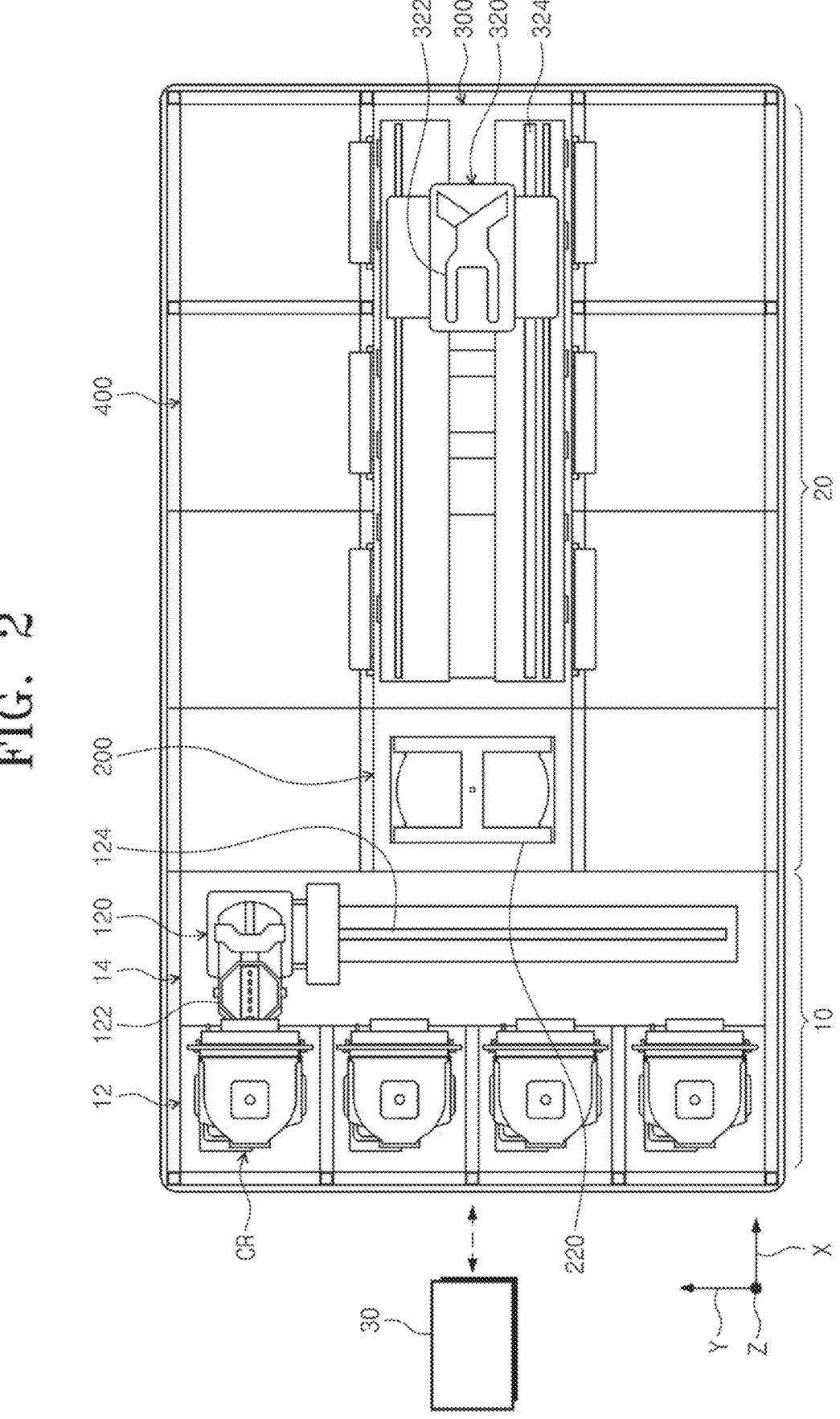
FIG. 2 is a top plan view schematically illustrating a substrate treating apparatus according to an exemplary embodiment of the present invention.

Hereinafter, an exemplary embodiment of the present invention will be described in detail with reference to FIGS. 2 to 20. FIG. 2 is a top plan view schematically illustrating a substrate treating apparatus according to an exemplary embodiment of the present invention.

Referring to FIG. 2, a substrate treating apparatus 1 includes an index module 10, a treating module 20, and a controller 30. According to the exemplary embodiment, the index module 10 and the treating module 20 may be disposed along one direction when viewed from the top.

Hereinafter, the direction in which the index module 10 and the treating module 20 are arranged is defined as a first direction X, when viewed from the front, a direction perpendicular to the first direction X is defined to as a second direction Y, and a direction perpendicular to a plane including both the first direction X and the second direction Y is defined as a third direction Z.

The index module 10 transfers a substrate M from a container C in which the substrate M is accommodated to the treating module 20 that treats the substrate M. In addition, the index module 10 accommodates the substrate M on which a predetermined treatment has been completed in the treating module 20 in the container C. A longitudinal direction of the index module 10 may be formed in the second direction Y. The index module 10 may have a load port 12 and an index frame 14.

The container C in which the substrate M is accommodated is seated on the load port 12. The load port 12 may be located on the opposite side of the treating module 20 with respect to the index frame 14. A plurality of load ports 12 may be provided. The plurality of load ports 12 may be arranged in a line along the second direction Y. The number of load ports 120 may be increased or decreased according to process efficiency of the treating module 20 and a condition of foot print, and the like.

As the container C, an airtight container, such as a Front Opening Unfed Pod (FOUP) may be used. The container C may be placed on the load port 12 by a transfer means (not illustrated), such as an overhead transfer, an overhead conveyor, or an automatic guided vehicle, or an operator.

The index frame 14 provides a transfer space for transferring the substrate M. The index frame 14 is provided with an index robot 120 and an index rail 124. The index robot 120 transfers the substrate M. The index robot 120 may transfer the substrate M between the index module 10 and a buffer unit 200 to be described later. The index robot 120 includes an index hand 122. The substrate M may be placed on the index hand 122. The index hand 122 may be provided to be movable forward and backward, rotatable about the third direction Z, and movable in the third direction Z. A plurality of hands 122 may be provided. The plurality of index hands 122 may be provided to be spaced apart from each other in the vertical direction. The plurality of index hands 122 may move forward and backward independently of each other.

The index rail 124 is provided within the index frame 14. A longitudinal direction of the index rail 124 is provided along the second direction Y. The index robot 120 is placed on the index rail 124, and the index robot 120 may be provided to be movable in a straight line on the index rail 124.

The controller 30 may control the substrate treating apparatus 1. The controller 30 may include a process controller formed of a microprocessor (computer) that executes the control of the substrate treating apparatus, a user interface formed of a keyboard in which an operator performs a command input operation or the like in order to manage the substrate treating apparatus, a display for visualizing and displaying an operation situation of the substrate treating apparatus, and the like, and a storage unit storing a control program for executing the process executed in the substrate treating apparatus under the control of the process controller or a program, that is, a treatment recipe, for executing the process in each component according to various data and treatment conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

The controller 30 may control the substrate treating apparatus 1 so as to perform a substrate treating method described below. For example, the controller 30 may control configurations provided to a liquid treating chamber 400 to perform the substrate treating method described below.

The treating module 20 may include a buffer unit 200, a transfer frame 300, and a liquid treating chamber 400. The buffer unit 200 provides a space in which the substrate M loaded to the treating module 20 and the substrate M unloaded from the treating module 20 temporarily stay. The transfer frame 300 provides a space for transferring the substrate M between the buffer unit 200, the liquid treating chamber 400, and a drying chamber 500. The liquid treating chamber 400 performs a liquid treatment process of liquid-treating the substrate M by supplying a liquid onto the substrate M. The drying chamber 500 performs a drying process of drying the substrate M for which the liquid treatment has been completed.

The buffer unit 200 may be disposed between the index frame 14 and the transfer frame 300. The buffer unit 200 may be located at one end of the transfer frame 300. A slot (not illustrated) in which the substrate M is placed is provided inside the buffer unit 200. A plurality of slots (not illustrated) may be provided. The plurality of slots (not illustrated) may be spaced apart from each other in the third direction Z.

A front face and a rear face of the buffer unit 200 are opened. The front face is a surface facing the index module 10, and the rear face is a surface facing the transfer frame 300. The index robot 120 may approach the buffer unit 200 through the front face, and a transfer robot 320 to be described later may approach the buffer unit 200 through the rear face.

A longitudinal direction of the transfer chamber 300 may be provided in the first direction X. The liquid treating chamber 400 and the drying chamber 500 may be disposed on both sides of the transfer frame 300. The liquid treating chamber 400 and the drying chamber 500 may be disposed on the side of the transfer frame 300. The transfer frame 300 and the liquid treating chamber 400 may be disposed in the second direction Y. The transfer frame 300 and the drying chamber 500 may be disposed in the second direction Y.

According to the exemplary embodiment, the liquid treating chambers 400 may be disposed on both sides of the transfer frame 300. On one side of the transfer frame 300, the liquid treating chambers 400 may be provided in an arrangement of A×B (A and B are each 1 or a natural number greater than 1) in each of the first direction X and the third direction Z.

The transfer frame 300 includes the transfer robot 320 and a transfer rail 324. The transfer robot 320 transfers the substrate M. The transfer robot 320 transfers the substrate M between the buffer unit 200, the liquid treating chamber 400, and the drying chamber 500. The transfer robot 320 includes a transfer hand 322 on which the substrate M is placed. The substrate M may be placed on the transfer hand 322. The transfer hand 322 may be provided to be movable forward and backward, rotatable about the third direction Z, and movable along the third direction Z. A plurality of hands 322 are provided while being vertically spaced apart from each other, and the hands 322 may move forward and backward independently of each other.

The transfer rail 324 may be provided inside the transfer frame 300 along the longitudinal direction of the transfer frame 300. For example, the longitudinal direction of the transfer rail 324 may be provided in the first direction X. The transfer robot 320 may be placed on the transfer rail 324, and the transfer robot 320 may be provided to be movable on the transfer rail 324.

Figure 3:
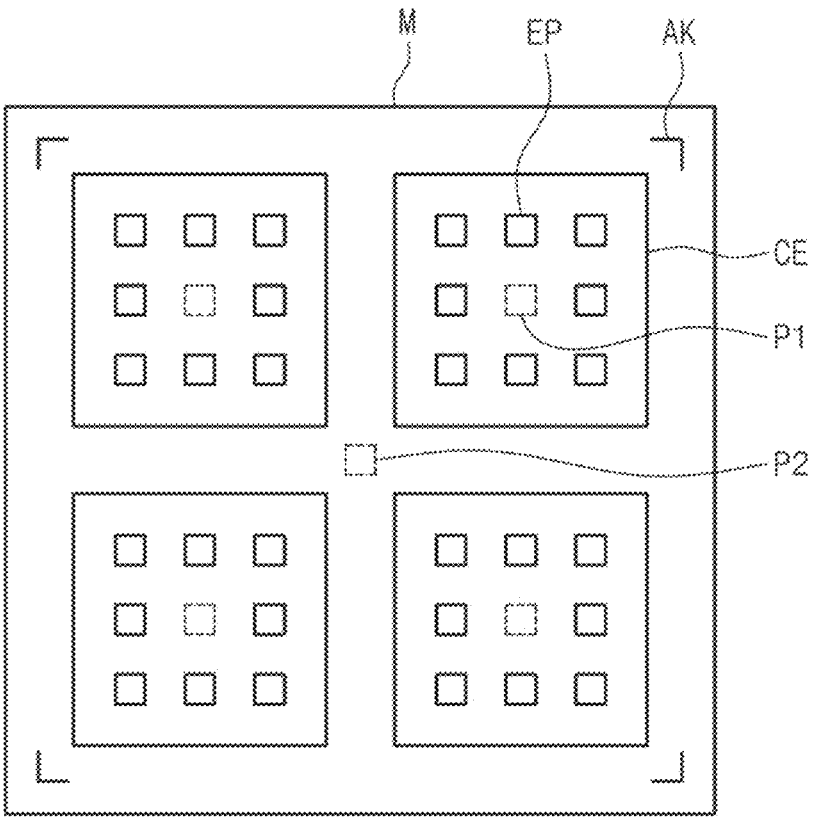
FIG. 3 is a diagram schematically illustrating a substrate treated in a liquid treating chamber of FIG. 2 viewed from the top.

FIG. 3 is a diagram schematically illustrating a substrate treated in a liquid treating chamber of FIG. 2 viewed from the top. Hereinafter, the substrate M treated in the liquid treating chamber 400 according to the exemplary embodiment of the present invention will be described in detail with reference to FIG. 3.

Referring to FIG. 3, an object to be treated in the liquid treating chamber 400 may be a substrate of any one of a wafer, a glass, and a photomask. For example, the substrate M treated in the liquid treating chamber 400 according to the exemplary embodiment of the present invention may be a photo mask that is a 'frame' used in the exposure process.

The substrate M may have a quadrangular shape. The substrate M may be a photomask that is a 'frame' used in the exposure process. A reference mark AK, a first pattern P1, and a second pattern P2 may be formed on the substrate M.

At least one reference mark AK may be formed on the substrate M. For example, a plurality of reference marks AK may be formed in each edge region of the substrate M. The reference mark AK may be a mark used for aligning the substrate M called an align key. In addition, the reference mark AK may be a mark used to derive position information of the substrate M. For example, a photographing unit 4550 to be described later may acquire an image by photographing the reference mark AK, and transmit the acquired image to the controller 30. The controller 30 may analyze the image including the reference mark AK to detect the exact position of the substrate M. Also, the reference mark AK may be used to determine the position of the substrate M when the substrate M is transferred.

A cell CE may be formed on the substrate M. At least one cell CE may be formed. A plurality of patterns may be formed in each of the plurality of cells CE. A plurality of patterns may be formed in each of the plurality of cells CE. The patterns formed in each cell CE may be defined as one pattern group. The patterns formed in each cell CE may include an exposure pattern EP and a first pattern P1.

The exposure pattern EP may be used to form an actual pattern on the substrate M. The first pattern P1 may be a pattern representative of the exposure patterns EP formed in one cell CE. Further, when the cell CE is provided in plurality, the first pattern P1 may be provided in plurality. For example, each of the plurality of cells CE may be provided with the first pattern P1. However, the present invention is not limited thereto, and a plurality of first patterns P1 may be formed in one cell CE. The first pattern P1 may have a shape in which portions of the respective exposure patterns EP are combined. The first pattern P1 may be referred to as a monitoring pattern. An average value of the critical dimensions of the plurality of first patterns P1 may be referred to as a Critical Dimension Monitoring Macro (CDMM).

When an operator inspects the first pattern P1 formed in any one cell CE through a Scanning Electron Microscope (SEM), whether the shape of the exposure patterns EP formed in any one cell CE is satisfactory may be estimated. Accordingly, the first pattern P1 may function as a pattern for inspection. Unlike the above-described example, the first pattern P1 may be any one of the exposure patterns EP participating in the actual exposure process. Optionally, the first pattern P1 may be a pattern for inspection and an exposure pattern participating in the actual exposure at the same time.

Figure 4A:
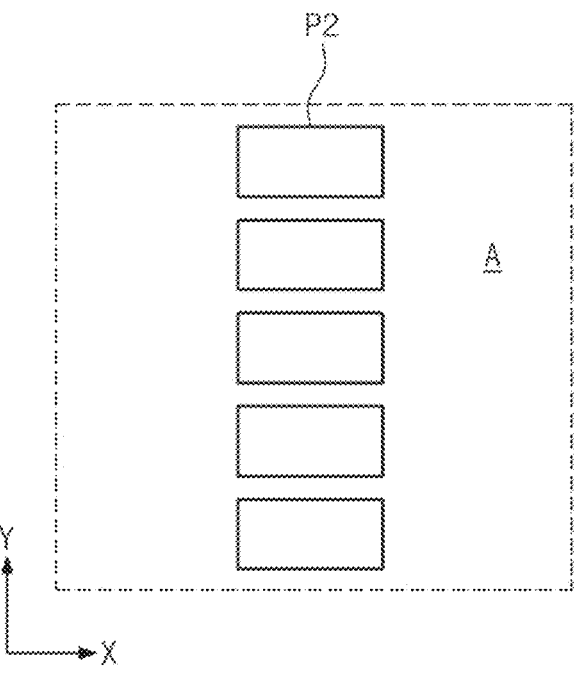
FIG. 4A is a diagram schematically illustrating an enlarged view of an exemplary embodiment of a second pattern formed on the substrate of FIG. 3 viewed from the top.
Figure 4B:
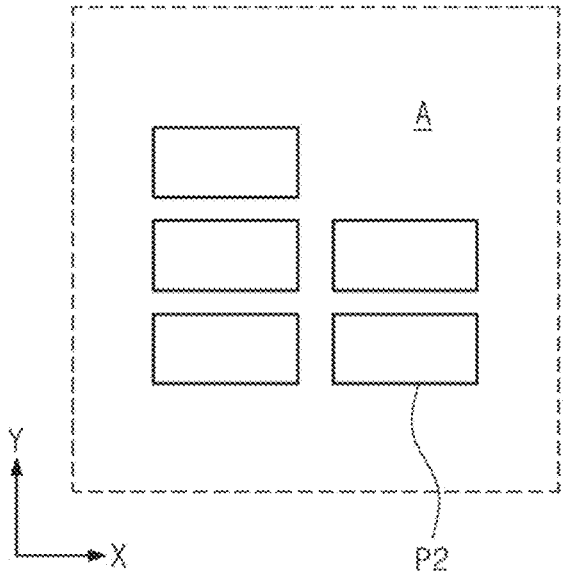
FIG. 4B is a diagram schematically illustrating an enlarged view of another exemplary embodiment of the second pattern formed on the substrate of FIG. 3 viewed from the top.
Figure 4C:
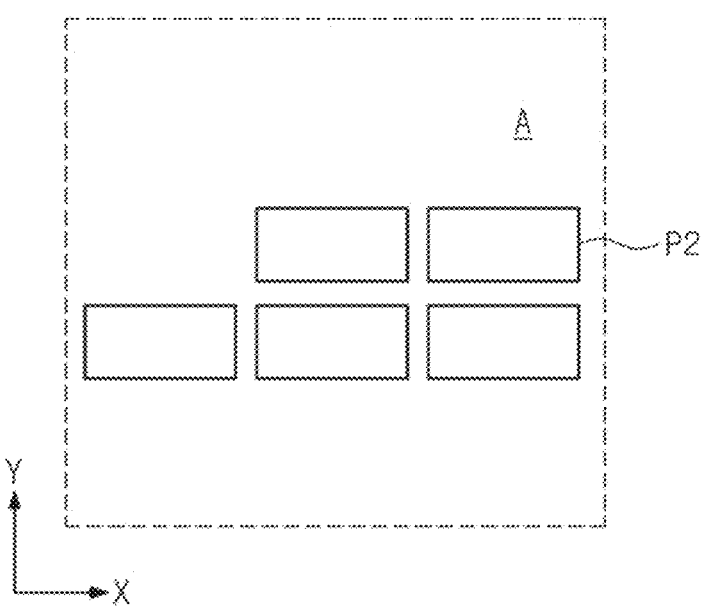
FIG. 4C is a view schematically illustrating an enlarged view of exemplary another embodiment of the second pattern formed on the substrate of FIG. 3 viewed from the top.

FIG. 4A is a diagram schematically illustrating an enlarged view of an exemplary embodiment of a second pattern formed on the substrate of FIG. 3 viewed from the top. FIG. 4B is a diagram schematically illustrating an enlarged view of another exemplary embodiment of the second pattern formed on the substrate of FIG. 3 viewed from the top. FIG. 4C is a view schematically illustrating an enlarged view of exemplary another embodiment of the second pattern formed on the substrate of FIG. 3 viewed from the top. Hereinafter, the second pattern according to the exemplary embodiment of the present invention will be described in detail with reference to FIGS. 3, 4A, 4B, and 4C.

Referring to FIG. 3, the second pattern P2 may be a pattern representative of the exposure patterns EP formed on the entire substrate M. The second pattern P2 may be formed outside the cells CE formed on the substrate M. For example, the second pattern P2 may be located outside the region in which the plurality of cells CE is provided. The second pattern P2 may be formed in a specific region A located outside the region in which the plurality of cells CE are provided.

At least one second pattern P2 may be provided. For example, a plurality of second patterns P2 may be provided. The plurality of second patterns P2 may be arranged in a serial arrangement and/or a parallel arrangement. As illustrated in FIG. 4A, the plurality of second patterns P2 according to the exemplary embodiment of the present invention may be arranged in series along the first direction X when viewed from top. Alternatively, the plurality of second patterns P2 may also be arranged in series along the second direction Y when viewed from the top.

Optionally, the plurality of second patterns P2 according to the exemplary embodiment of the present invention may be arranged in a combination in which the serial arrangement and the parallel arrangement are mixed. For example, as illustrated in FIG. 4B, the plurality of second patterns P2 may be arranged in a combination of three rows lines and two columns. Also, as illustrated in FIG. 4C, the plurality of second patterns P2 may be arranged in a combination of two rows and three columns. The arrangement form of the second patterns P2 according to the exemplary embodiment of the present invention described with reference to FIGS. 4A to 4C is merely an example for convenience of description, and the arrangement form of the second patterns P2 according to the exemplary embodiment of the present invention may be variously modified and arranged in a form in which the serial arrangement and the parallel arrangement are mixed.

When an operator inspects the second pattern P2 through the SEM, whether the shape of the exposure patterns EP formed on one substrate M is satisfactory may be estimated. Accordingly, the second pattern P2 may function as a pattern for inspection. The second pattern P2 may be a pattern for inspection that does not participate in the actual exposure process. The second pattern P2 may be a pattern for setting process conditions of an exposure apparatus. The second pattern P2 may be referred to as an anchor pattern.

Hereinafter, the liquid treating chamber 400 according to the exemplary embodiment of the present invention will be described in detail. In addition, hereinafter, the present invention will be described based on an example in which the treatment performed in the liquid treating chamber 400 is a Fine Critical Dimension Correction (FCC) in the process of manufacturing the mask for the exposure process.

The substrate M loaded into and treated in the liquid treating chamber 400 may be the substrate M on which a pre-treatment has been performed. Critical dimensions of the first pattern P1 and the second pattern P2 of the substrate M loaded into the liquid treating chamber 400 may be different from each other. According to the exemplary embodiment, the critical dimension of the first pattern P1 may be relatively larger than the critical dimension of the second pattern P2. For example, the critical dimension of the first pattern P1 may have a first width (for example, 69 nm), and the critical dimension of the second pattern P2 may have a second width (for example, 68.5 nm).

Figure 5:
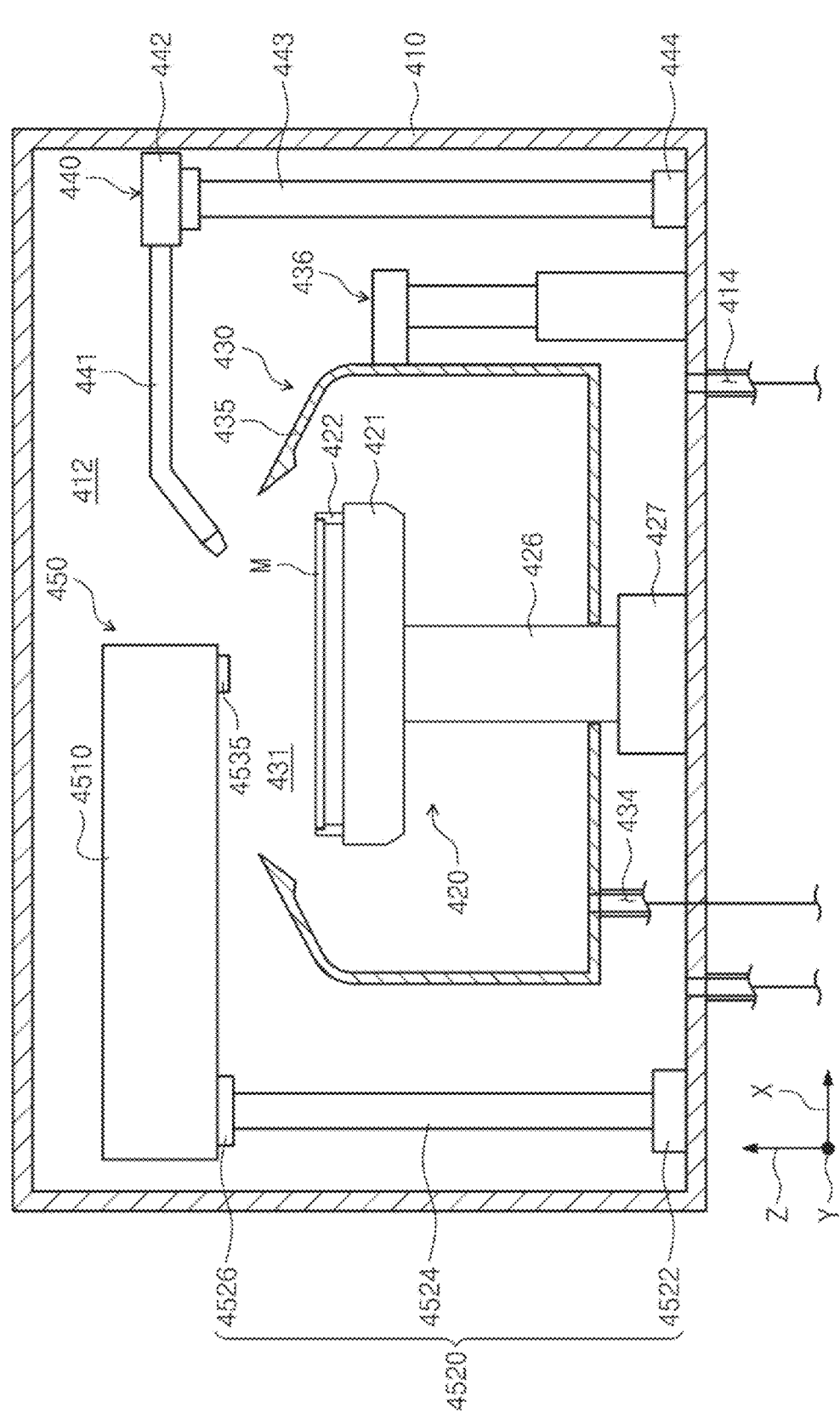
FIG. 5 is a diagram schematically illustrating an exemplary embodiment of the liquid treating chamber of FIG. 2.
Figure 6:
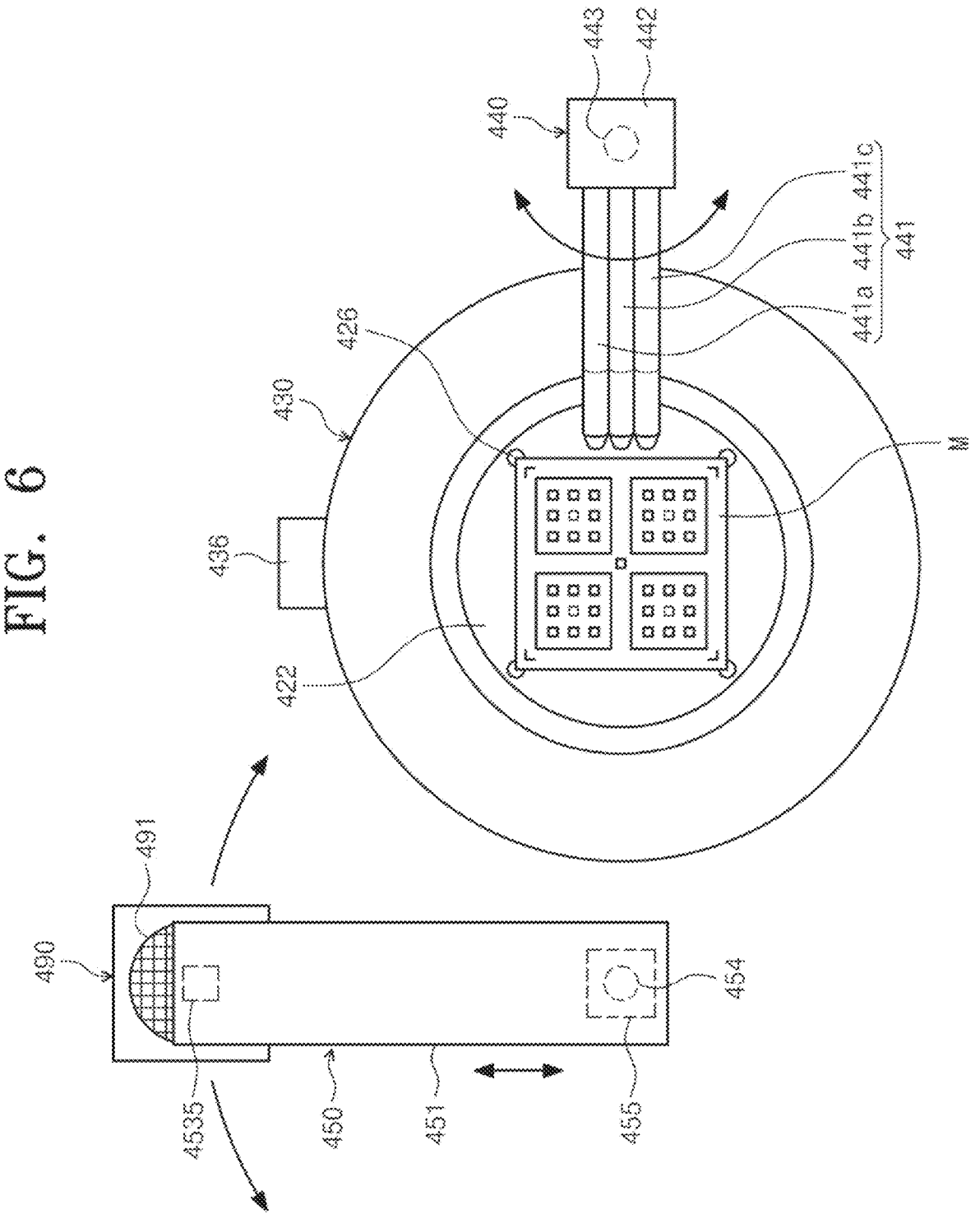
FIG. 6 is a view of the liquid treating chamber of FIG. 5 viewed from the top.

FIG. 5 is a diagram schematically illustrating an exemplary embodiment of the liquid treating chamber of FIG. 2. FIG. 6 is a view of the liquid treating chamber of FIG. 5 viewed from the top. Referring to FIGS. 5 and 6, the liquid treating chamber 400 may include a housing 410, a support unit 420, a treating container 430, a liquid supply unit 440, an irradiating module 450, and a home port 490.

The housing 410 has an inner space 412. The support unit 420, the treating container 430, the liquid supply unit 440, the irradiating module 450, and the home port 490 may be provided in the inner space 412. The housing 410 may be provided with an entrance (not illustrated) through which the substrate M may be loaded in and out. An inner wall surface of the housing 410 may be coated with a material having high corrosion resistance to chemicals supplied by the liquid supply unit 440.

An exhaust hole 414 may be formed in the bottom surface of the housing 410. The exhaust hole 414 may be connected to an exhaust member (not illustrated), such as a pump, capable of exhausting the internal space 412. Fume and the like that may be generated in the inner space 412 may be exhausted to the outside of the housing 410 through the exhaust hole 414.

The support unit 420 supports the substrate M. The support unit 420 may support the substrate M in the treatment space provided by the treating container 430 to be described later. The support unit 420 rotates the substrate M. The support unit 420 may include a body 421, a support pin 422, a support shaft 426, and a driving member 427.

The body 421 may be provided in a plate shape. The body 421 may have a plate shape having a predetermined thickness. When viewed from the top, the body 421 may have an upper surface provided in a generally circular shape. The upper surface of the body 421 may have a relatively larger area than the substrate M. The support pin 422 may be coupled to the body 421.

The support pins 422 support the substrate M. The support pin 422 may have a generally circular shape when viewed from the top. When viewed from the top, the support pin 422 may have a shape in which a portion corresponding to the corner region of the substrate M is recessed downward. The support pin 422 may have a first surface and a second surface. For example, the first surface may support the lower portion of the edge region of the substrate M. The second surface may face the side of the edge region of the substrate M. Accordingly, when the substrate M is rotated, the movement of the substrate M in the lateral direction may be restricted by the second surface.

At least one support pin 422 is provided. For example, a plurality of support pins 422 may be provided. The support pins 422 may be provided in a number corresponding to the number of corner regions of the substrate M having a quadrangular shape. The support pin 422 may support the substrate M so that the lower surface of the substrate M and the upper surface of the body 421 are spaced apart from each other.

The support shaft 426 is coupled to the body 421. The support shaft 426 is located below the body 421. The support shaft 426 may be a hollow shaft. A fluid supply line 428 may be formed inside the hollow shaft. The fluid supply line 428 may supply a treatment fluid and/or treatment gas to a lower portion of the substrate M. For example, the treatment fluid may include a chemical or rinse solution. The chemical may be a liquid having acid or basic properties. The rinse solution may be pure water. For example, the treatment gas may be inert gas. The treatment gas may dry the lower portion of the substrate M. However, unlike the above-described example, the fluid supply line 428 may not be provided inside the support shaft 426.

The support shaft 426 may move in the vertical direction by the driving member 427. The support shaft 426 may be rotated by the driving member 427. The driving member 427 may be a hollow motor. When the driving member 427 rotates the support shaft 426, the body 421 coupled to the support shaft 426 may rotate. The substrate M may be rotated with the rotation of the body 421 through the support pin 422.

The treating container 430 has a treatment space. The treating container 430 has a treatment space in which the substrate M is treated. According to the example, the treating container 430 may have a treatment space with an open top. The treating container 430 may have a cylindrical shape with an open top. The substrate M may be subjected to liquid treatment and heat treatment in the treatment space. The treating container 430 may prevent the treatment liquid supplied to the substrate M from scattering to the housing 410, the liquid supply unit 440, and the irradiating module 450.

An opening into which the support shaft 426 is inserted may be formed in the bottom surface of the treating container 430 when viewed from the top. A discharge hole 434 through which the treatment liquid supplied by the liquid supply unit 440 may be discharged to the outside may be formed in the bottom surface of the treating container 430. A side surface of the treating container 430 may extend upwardly from the bottom surface in the third direction Z. The upper end of the treating container 430 may be inclined. For example, the upper end of the treating container 430 may extend upwardly while being inclined with respect to the ground as it goes toward the substrate M supported by the support unit 420.

The treating container 430 is coupled to the lifting member 436. The lifting member 436 may move the treating container 430 in the third direction Z. The lifting member 436 may be a driving device that moves the treating container 430 in the vertical direction. The lifting member 436 may move the treating container 430 in the upward direction while the liquid treatment and/or the heating treatment are performed on the substrate M. The lifting member 436 may move the treating container 430 in a downward direction when the substrate M is loaded into the internal space 412 and when the substrate M is unloaded from the internal space 412.

The liquid supply unit 440 may supply a liquid onto the substrate M. The liquid supply unit 440 may supply a treatment liquid for liquid-treating the substrate M. The liquid supply unit 440 may supply the treatment liquid to the substrate M supported by the support unit 420. For example, the liquid supply unit 440 may supply the treatment liquid to the substrate M on which the first pattern P1 formed in the plurality of cells CE and the second pattern P2 formed outside the region where the cells CE are formed.

The treatment liquid may be provided as an etching solution or a rinse solution. The etching solution may be a chemical. The etching solution may etch the pattern formed on the substrate M. The etching solution may be referred to as an etchant. The etchant may be a liquid containing hydrogen peroxide and a mixture in which ammonia, water, and an additive are mixed. The rinse solution may clean the substrate M. The rinse solution may be provided as a known chemical liquid.

The liquid supply unit 440 may include a nozzle 441, a fixed body 442, a rotation shaft 443, and a rotation member 444. The nozzle 441 may supply the treatment liquid to the substrate M supported by the support unit 420. One end of the nozzle 441 may be connected to the fixed body 442, and the other end of the nozzle 441 may extend from the fixed body 442 toward the substrate M. The nozzle 441 may extend from the fixed body 442 in the first direction X. The other end of the nozzle 441 may be bent and extended at a predetermined angle in a direction toward the substrate M supported by the support unit 420.

The nozzle 441 may include a first nozzle 441*a*, a second nozzle 441*b*, and a third nozzle 441*c*. Any one of the first nozzle 441*a*, the second nozzle 441*b*, and the third nozzle 441*c* may supply a chemical among the above-described treatment liquids. Further, another one of the first nozzle 441*a*, the second nozzle 441*b*, and the third nozzle 441*c* may supply a rinse solution among the above-described treatment liquids. Another one of the first nozzle 441*a*, the second nozzle 441*b*, and the third nozzle 441*c* may supply different types of chemicals from those supplied by any one of the first nozzle 441*a*, the second nozzle 441*b*, and the third nozzle 441*c*.

The fixed body 442 may fix and support the nozzle 441. The fixed body 442 may be connected to the rotation shaft 443 rotated based on the third direction Z by the rotation member 444. When the rotation member 444 rotates the rotation shaft 443, the fixed body 442 may be rotated about the third direction Z. Accordingly, a discharge port of the nozzle 441 may be moved between a liquid supply position, which is a position where the treatment liquid is supplied to the substrate M, and a standby position, which is a position where the treatment liquid is not supplied to the substrate M.

Figure 7:
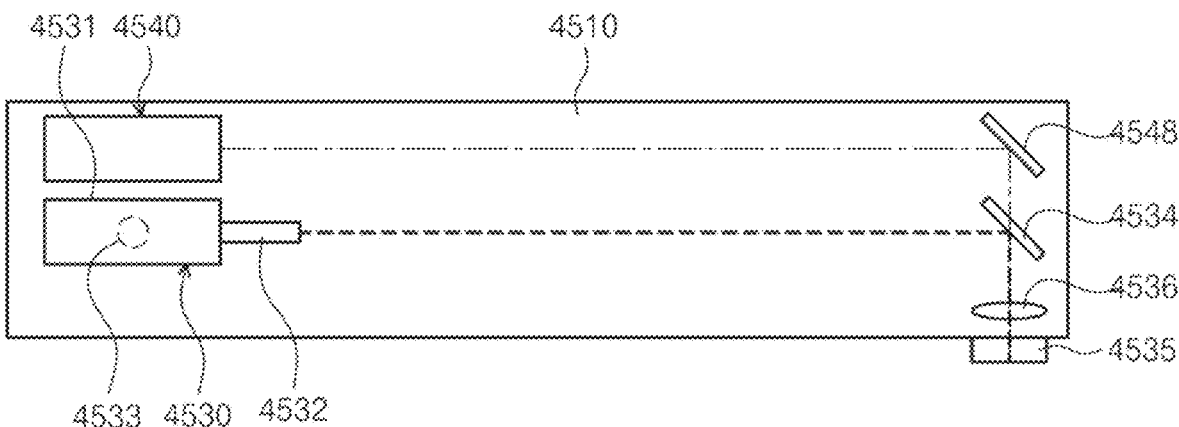
FIG. 7 is a diagram schematically illustrating an irradiating module of FIG. 5 viewed from the front.
Figure 8:
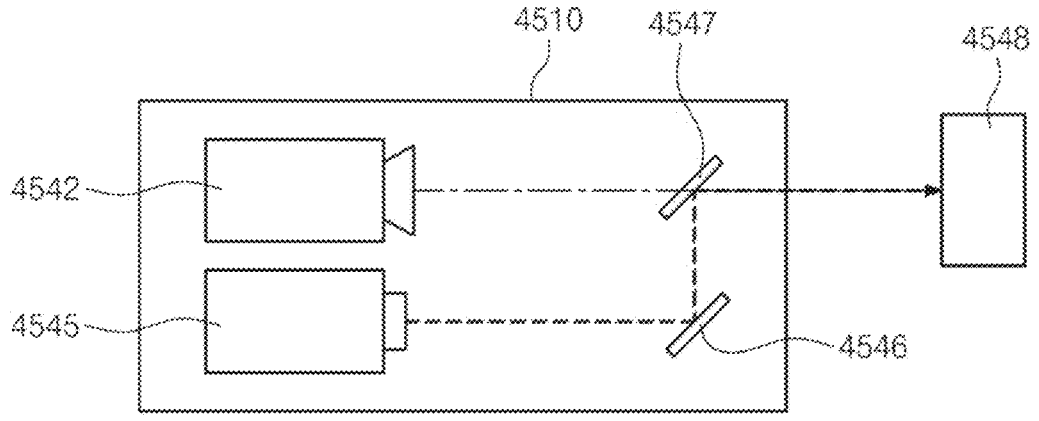
FIG. 8 is a diagram schematically illustrating the irradiating module of FIG. 7 viewed from the top.

FIG. 7 is a diagram schematically illustrating the irradiating module of FIG. 5 viewed from the front. FIG. 8 is a diagram schematically illustrating the irradiating module of FIG. 7 viewed from the top.

Referring to FIGS. 5 to 8, the irradiating module 450 may perform the heat treatment on the substrate M. The irradiating module 450 may heat the substrate M to which the treatment liquid is supplied. For example, the irradiating module 450 may heat a specific region of the substrate M by irradiating laser light to the substrate M on which the liquid film is formed, after the liquid is supplied onto the substrate M by the liquid supply unit 440.

The irradiating module 450 may perform the heat treatment on the substrate M. The irradiating module 450 may irradiate light to the substrate M. For example, the irradiating module 450 may capture an image and/or a video in which the substrate M is heat-treated. The irradiating module 450 may include a housing 4510, a moving unit 4520, a laser unit 4530, and a photographing unit 4540.

The housing 4510 has an installation space therein. The laser unit 4530 and the photographing unit 4540 may be located in the installation space of the housing 4510. For example, the laser unit 4530, a camera unit 4542, and the lighting unit 4544 may be located in the installation space of the housing 4510. The housing 4510 protects the laser unit 4530 and the photographing unit 4540 from particles, fumes, or scattering liquids generated during a process.

An opening may be formed in a lower portion of the housing 4510. An irradiation end 4535 to be described later may be inserted into the opening of the housing 4510. When the irradiation end 4535 is inserted into the opening of the housing 4510, one end of the irradiation end 4535 may protrude from the lower end of the housing 4510.

The moving unit 4520 moves the housing 4510. The moving unit 4520 may move the irradiation end 4535 to be described later by moving the housing 4510. The moving unit 4520 may include a driver 4522, a shaft 4524, and a moving member 4526.

The driver 4522 may be a motor. The driver 4522 may be connected to the shaft 4524. The actuator 4522 may move the shaft 4524 in the vertical direction. The driver 4522 may rotate the shaft 4524. For example, a plurality of drivers 4522 may be provided. Any one of the plurality of drivers 4522 may be provided as a rotary motor for rotating the shaft 4524, and the other of the plurality of drivers 4522 may be provided as a linear motor for moving the shaft 4524 in the vertical direction.

The shaft 4524 may be connected to the housing 4510. The shaft 4524 may be connected to the housing 4510 via the moving member 4526. As the shaft 4524 rotates, the housing 4510 may also rotate. Accordingly, the position of the irradiation end 4535 to be described later may also be changed. For example, the position of the irradiation end 4535 may be changed in the third direction Z. In addition, the position of the irradiation end 4535 may be changed in the third direction Z as a rotation axis.

When viewed from the top, the center of the irradiation end 4535 may move in an arc toward the center of the shaft 4524. When viewed from the top, the center of the irradiation end 4535 may be moved to pass through the center of the substrate M supported by the support unit 420. The irradiation end 4535 may be moved between a process position where the laser light L is irradiated to the substrate M and a standby position where the substrate waits without performing the heat treatment on the substrate M by the moving unit 4520.

The irradiation position may be an upper portion of the second pattern P2 formed on the substrate M supported by the support unit 420. The irradiation position may be a position corresponding to the specific region A in which the second pattern P2 formed on the substrate M is formed when viewed from the top. For example, the irradiation position may be a position where the center C of the second pattern P2 and the center CC of the laser light R coincide with each other when viewed from the top. The home port 460 to be described later is located in the standby position.

The moving member 4526 may be provided between the housing 4510 and the shaft 4524. The moving member 4526 may be an LM guide. The moving member 4526 may move the housing 4510 laterally. The moving member 4526 may move the housing 4510 in the first direction X and/or the second direction Y. The position of the irradiation end 4535 may be variously changed by the driver 4522 and the moving member 4526.

The laser unit 4530 may heat the substrate M. The heating unit 460 may heat the substrate M supported by the support unit 420. The laser unit 4530 may heat a partial region of the substrate M. The laser unit 4530 may heat the specific region A of the substrate M. The laser unit 4530 may be supplied with a chemical to heat the substrate M on which the liquid film is formed. The laser unit 4530 may heat the pattern formed in the specific region A of the substrate M. The laser unit 4530 may heat any one of the first pattern P1 and the second pattern P2. The laser unit 4530 may heat the second pattern P2 between the first pattern P1 and the second pattern P2. According to the exemplary embodiment, the laser unit 4530 may heat the second pattern P2 by irradiating the laser light L. The laser unit 4530 may heat the plurality of second patterns P2 existing in the specific region A by irradiating the laser light L at the irradiation position.

The laser unit 4530 may include a laser irradiation unit 4531, a beam expander 4532, a tilting member 4533, a lower reflective member 4534, and a lens member 4535. The laser irradiation unit 4531 irradiates the laser light L. The laser irradiation unit 4531 may irradiate the laser light L having straightness. The laser light L irradiated from the laser irradiation unit 4531 may be a flat-top. For example, the laser light L irradiated from the laser irradiation unit 4531 may have a substantially circular shape when viewed from the top.

The laser light L irradiated from the laser irradiation unit 4531 may be irradiated to the substrate M through the lower reflective member 4534 and the lens member 4535, which will be described later, in sequence. For example, the laser light L irradiated from the laser irradiation unit 4531 may be irradiated to the second pattern P2 formed in the specific region A of the substrate M through the lower reflective member 4534 and the lens member 4535 in sequence. A diameter D of the laser light L irradiated to the second pattern P2 formed in the specific region A of the substrate M through the laser irradiation unit 4531, the lower reflection member 4534, and the lens member 4535 in sequence will be described in detail below.

The beam expander 4532 may control the characteristics of the laser light L irradiated from the laser irradiation unit 4531. The beam expander 4532 may adjust the shape of the laser light L irradiated from the laser irradiation unit 4531.

In addition, the beam expander 4532 may adjust the profile of the laser light L irradiated from the laser irradiation unit 4531. For example, the diameter D of the laser light L irradiated from the laser irradiation unit 4531 may be changed in the beam expander 4532. For example, the diameter D of the laser light L irradiated from the laser irradiation unit 4531 may be changed in the beam expander 4532. The diameter D of the laser light L irradiated by the laser irradiation unit 4531 will be described later.

The tilting member 4533 may tilt the irradiation direction of the laser light L irradiated by the laser irradiation unit 4531. The tilting member 4533 may rotate the laser irradiation unit 4531 about one axis. The tilting member 4533 may tilt the irradiation direction of the laser light L irradiated from the laser irradiation unit 4531 by rotating the laser irradiation unit 4531. The tilting member 4533 may include a motor.

The lower reflective member 4534 may change the irradiation direction of the laser light L irradiated from the laser irradiation unit 4531. For example, the lower reflective member 4534 may change the irradiation direction of the laser light L irradiated in the horizontal direction to the vertical downward direction. For example, the lower reflective member 4534 may change the irradiation direction of the laser light L to a direction toward the irradiation end 4535, which will be described later. The laser light L refracted by the lower reflective member 4534 may travel to the substrate M that is a to-be-treated object or a detection member 491 provided in the home port 460 to be described later through the lens member 4535 to be described later.

When viewed from the top, the lower reflective member 4534 may be positioned to overlap an upper reflective member 4548 to be described later. The lower reflective member 4534 may be disposed below the upper reflective member 4548. The lower reflective member 4534 may be tilted at the same angle as the upper reflective member 4548.

The lens member 4535 may include a lens 4536 and a barrel (not illustrated). For example, the lens 4536 may be an objective lens. The barrel (not illustrated) may be installed under the lens. The barrel (not illustrated) may have a generally cylindrical shape. The barrel (not illustrated) may be inserted into an opening formed at a lower end of the housing 4510. One end of the barrel (not illustrated) may be positioned to protrude from the lower end of the housing 4510.

The lens member 4535 may function as the irradiation end 4535 through which the laser light L is irradiated to the substrate M. The laser light L irradiated by the laser unit 4530 may be irradiated to the substrate M through the irradiation end 4535. The image photographing of the camera unit 4542 may be provided through the irradiation end 4535. The light irradiated by the lighting unit 4544 may be provided through the irradiation end 4535.

The photographing unit 4540 may photograph the laser light L irradiated from the laser unit 4530. The photographing unit 4540 may acquire an image, such as an image and/or a photo, of a region to which the laser light L is irradiated from the laser module 4330. The photographing unit 4540 may monitor the laser light L irradiated from the laser irradiation unit 4531. The photographing unit 4540 may acquire an image and/or a video of the laser light L irradiated from the laser irradiation unit 4531. For example, the photographing unit 4540 may acquire an image, such as an image and/or a photo, of the laser light L irradiated onto the substrate M, and transmit the data to the controller 30. Also, the photographing unit 4540 may acquire an image, such as an image and/or a photo, of the laser light L irradiated to the detection member 491 to be described later, and transmit the data to the controller 30.

The photographing unit 4540 may monitor information of the laser light L. For example, the photographing unit 4540 may monitor diameter D information of the laser light L. Also, the photographing unit 4540 may monitor center CC information of the laser light L. Also, the photographing unit 4540 may monitor profile information of the laser light L. The photographing unit 4540 may include the camera unit 4542, the lighting unit 4544, and the upper reflective member 4548.

The camera unit 4542 acquires an image of the laser light L irradiated from the laser irradiation unit 4531. For example, the camera unit 4542 may acquire an image including a point to which the laser light L irradiated from the laser irradiation unit 4531 is irradiated. Also, the camera unit 4542 acquires an image of the substrate M supported by the support unit 420.

The camera unit 4542 may be a camera. A photographing direction in which the camera unit 4542 acquires an image may face the upper reflective member 4548, which will be described later. The camera unit 4542 may transmit the acquired photo and/or image to the controller 30.

The lighting unit 4544 may provide light so that the camera unit 4542 is capable of easily acquiring an image. The lighting unit 4544 may include a lighting member 4545, a first reflective plate 4546, and a second reflective plate 4547. The lighting member 4545 irradiates light. The lighting member 4545 provides light. Light provided by the lighting member 4545 may be sequentially reflected along the first reflective plate 4546 and the second reflective plate 4547. The light provided by the lighting member 4545 may be reflected from the second reflective plate 4547 and may be irradiated in a direction toward the upper reflective member 4548 to be described later.

The upper reflective member 4548 may change the photographing direction of the camera unit 4542. For example, the upper reflective member 4548 may change the photographing direction of the camera unit 4542, which is the horizontal direction, to the vertical downward direction. For example, the upper reflective member 4548 may change the photographing direction of the camera unit 4542 to face the irradiation end 4535. The upper reflective member 4548 may change the irradiation direction of light from the lighting member 4545 sequentially passing and transmitted through the first reflective plate 4546 and the second reflective plate 4547 from the horizontal direction to the vertical downward direction. For example, the upper reflective member 4548 may change the irradiation direction of the light of the lighting unit 4544 toward the irradiation end 4535.

The upper reflective member 4548 and the lower reflective member 4534 may be positioned to overlap each other when viewed from the top. The upper reflective member 4548 may be disposed above the lower reflective member 4534. The upper reflective member 4548 and the lower reflective member 4534 may be tilted at the same angle. The upper reflective member 4548 and the lower reflective member 4534 may be provided so that the irradiation direction of the laser light L irradiated by the laser irradiation unit 4531, the photographing direction in which the camera unit 4542 acquires the image, and the irradiation direction of the light provided by the illumination unit 4544 are coaxial when viewed from the above.

Figure 9:
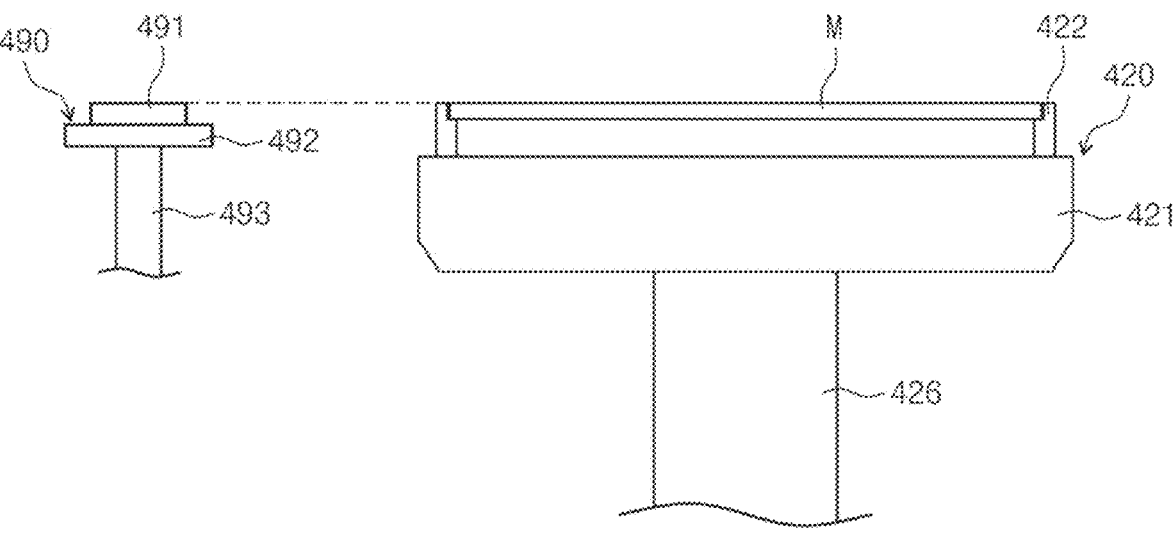
FIG. 9 is a diagram schematically illustrating an exemplary embodiment of a home port of FIG. 5.
Figure 10:
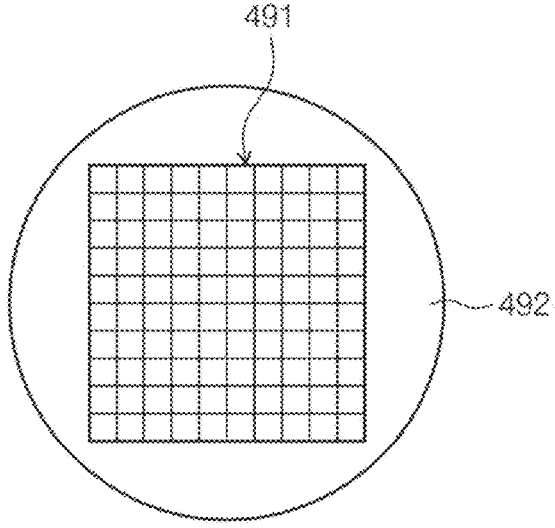
FIG. 10 is a diagram schematically illustrating the home port and a detection member of FIG. 9 viewed from the top.

FIG. 9 is a diagram schematically illustrating an exemplary embodiment of the home port of FIG. 5. FIG. 10 is a diagram schematically illustrating the home port and the detection member of FIG. 9 viewed from the top. As illustrated in FIG. 6, the home port 490 is located in the inner space 412 of the housing 410. The home port 460 may be installed in a region below the irradiation end 4535 when the irradiation end 4535 is in the standby position by the moving unit 4520. That is, the home port 490 provides the standby position where the laser unit 4530 waits.

Referring to FIGS. 9 and 10, the home port 490 may include the detection member 491, a plate 492, and a support frame 493. The detecting member 491 is provided in the home port 490. The detection member 491 may be located on the upper end of the plate 492 to be described later. For example, the detection member 491 may be located in a region below the irradiation end 4535 when the irradiation end 4535 is in the standby position.

The detection member 491 detects the characteristics of the laser light L irradiated from the laser unit 4530. For example, the detection member 491 may detect a diameter D of the laser light L, a sharpness of the laser light L, a circular ratio of the laser light L, a gradient of the laser light L, positional data of the center CC of the laser light L, and the like among the characteristics of the laser light L irradiated from the laser unit 4530.

According to the exemplary embodiment, the photographing unit 4540 may transmit the photo and/or the image of the detection member 491 and the laser light L irradiated to the detection member 491 to the controller 30. The controller 30 may change the characteristics of the laser light L based on the transmitted data of the laser light L.

The detection member 491 may be defined as a global coordinate system. A preset reference position TP may be marked in the detection member 491. A scale may be marked in the detection member 491 to check an error between the reference position and the position where the laser light L is irradiated to the detection member 491.

The detection member 491 may be coupled to the upper surface of the plate 492.

The plate 492 may be supported by the support frame 493. The support frame 493 may move up and down by a lifting member (not illustrated). The height of the detection member 491 determined by the plate 492 and the support frame 493 may be set to the same height as the substrate M supported by the support unit 420. The height from the bottom surface of the housing 410 to the upper surface of the detection member 491 may be the same as the height from the bottom surface of the housing 410 to the upper surface of the substrate M supported by the support unit 420. This is for the purpose of matching the height of the irradiation end 4535 when the characteristic of the laser light L is detected by using the detection member 491 and the height of the irradiation end 4535 when the substrate M is heated. In addition, when the irradiation direction of the laser light L irradiated by the laser irradiation unit 4531 is slightly shifted with respect to the third direction Z, the irradiation position of the laser light L may vary depending on the height of the irradiation end 4535, so that the detection member 491 may be provided at the same height as the substrate M supported by the support unit 420.

Hereinafter, the substrate treating method according to the exemplary embodiment of the present invention will be described in detail. The substrate treating method described below may be performed in the liquid treating chamber 400. Also, the controller 30 may control the components of the liquid treating chamber 400 so that the liquid treating chamber 400 performs the substrate treating method described below.

Figure 11:
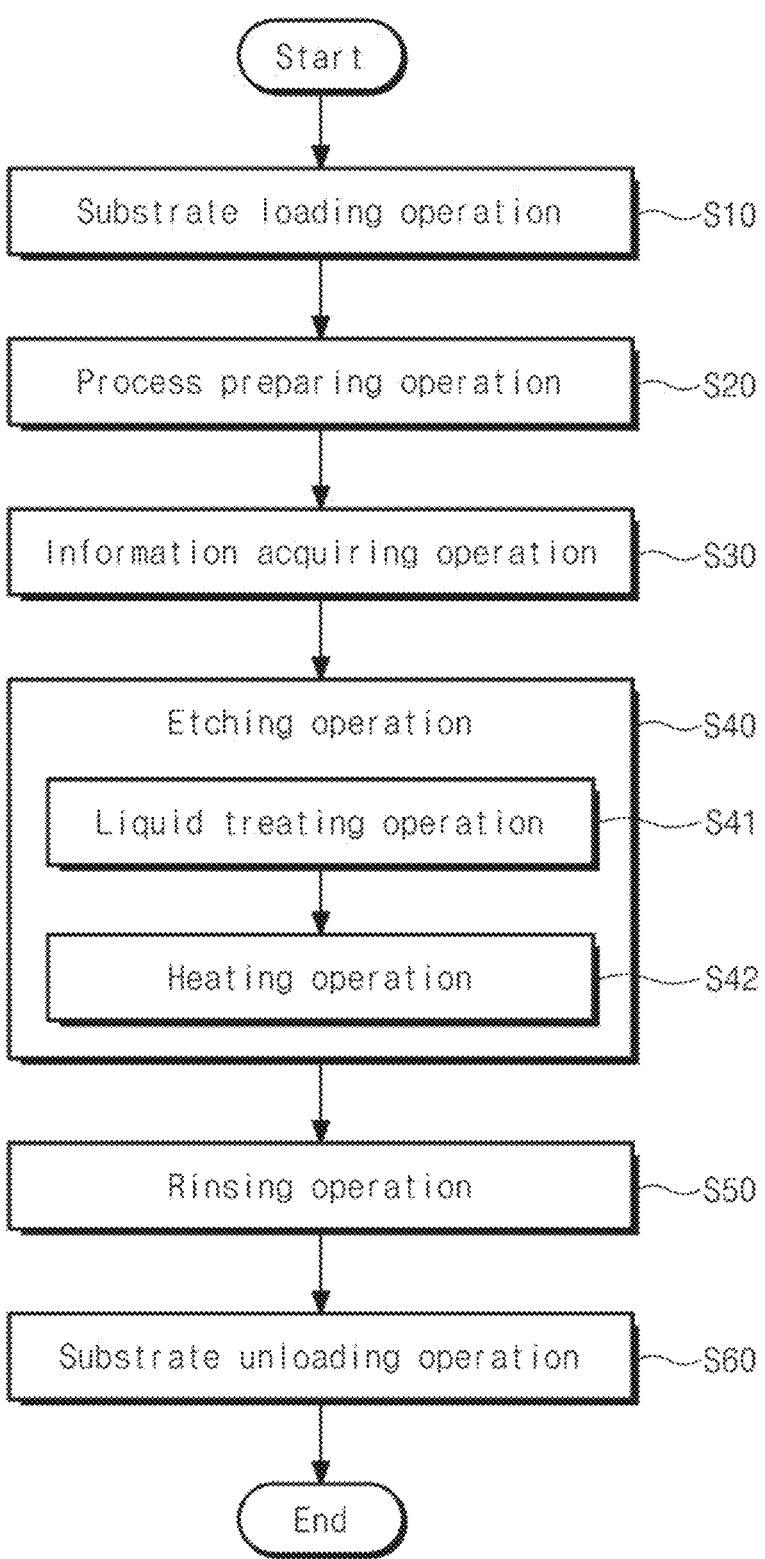
FIG. 11 is a flowchart illustrating a substrate treating method according to an exemplary embodiment of the present invention.

FIG. 11 is a flowchart illustrating a substrate treating method according to an exemplary embodiment of the present invention. Referring to FIG. 11, the substrate treating method according to the exemplary embodiment of the present invention may include a substrate loading operation S10, a process preparing operation S20, a location information acquiring operation S30, an etching operation S40, a rinsing operation S50, and a substrate unloading operation S60.

In the substrate loading operation S10, the substrate M is loaded into the inner space 412 of the housing 410. For example, in the substrate loading operation S10, a door (not illustrated) may open a loading/unloading port (not illustrated) formed in the housing 410. In the substrate loading operation S10, the transfer robot 320 may seat the substrate M on the support unit 420. The lifting member 436 may lower the position of the treating container 430 while the transfer robot 320 seats the substrate M on the support unit 420.

Figure 12:
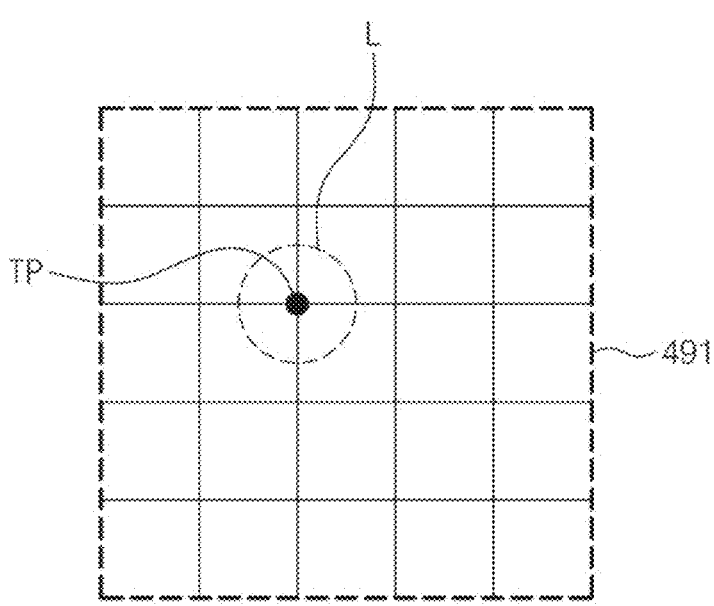
FIG. 12 is a diagram illustrating a state in which an error between a position where laser light is irradiated to a detection member and a preset target position is checked in a process preparation operation of FIG. 11.

FIG. 12 is a diagram illustrating a state in which an error between a position where laser light is irradiated to the detection member and a preset target position is checked in the process preparation operation of FIG. 11. Referring to FIG. 12, the process preparation operation S20 may be performed after the locating of the substrate M is completed. In the process preparation operation S20, it may be checked whether an error occurs in the irradiation position of the laser light L irradiated to the substrate M. For example, in the process preparation operation S20, it may be checked whether a preset center C of the laser light L is changed. For example, in the process preparation operation S20, it may be checked whether a preset diameter D of the laser light L is changed. For example, in the process preparation operation S20, it may be checked whether an irradiation height of the laser light L is changed. Setting values for the position with respect to the center CC of the laser light L, the diameter D of the laser light L, and the irradiation height of the laser light L may be stored or recorded in the controller 30.

In the process preparation operation S20, the laser unit 4530 may irradiate the laser light L for testing to the coordinate system of the detection member 491. As illustrated in FIG. 12, when the laser light L for test irradiated from the laser unit 4530 is irradiated to a position coincident with the preset reference position TP marked on the coordinate system of the detection member 491, it is determined that the laser irradiation unit 4531 is not distorted, and the location information acquiring operation S30, which will be described later, may be performed. In addition, in the process preparation operation S20, it is possible to not only check whether an error occurs in the irradiation position of the laser light L, but also return the components of the liquid treating chamber 400 to an initial state.

Figure 13:
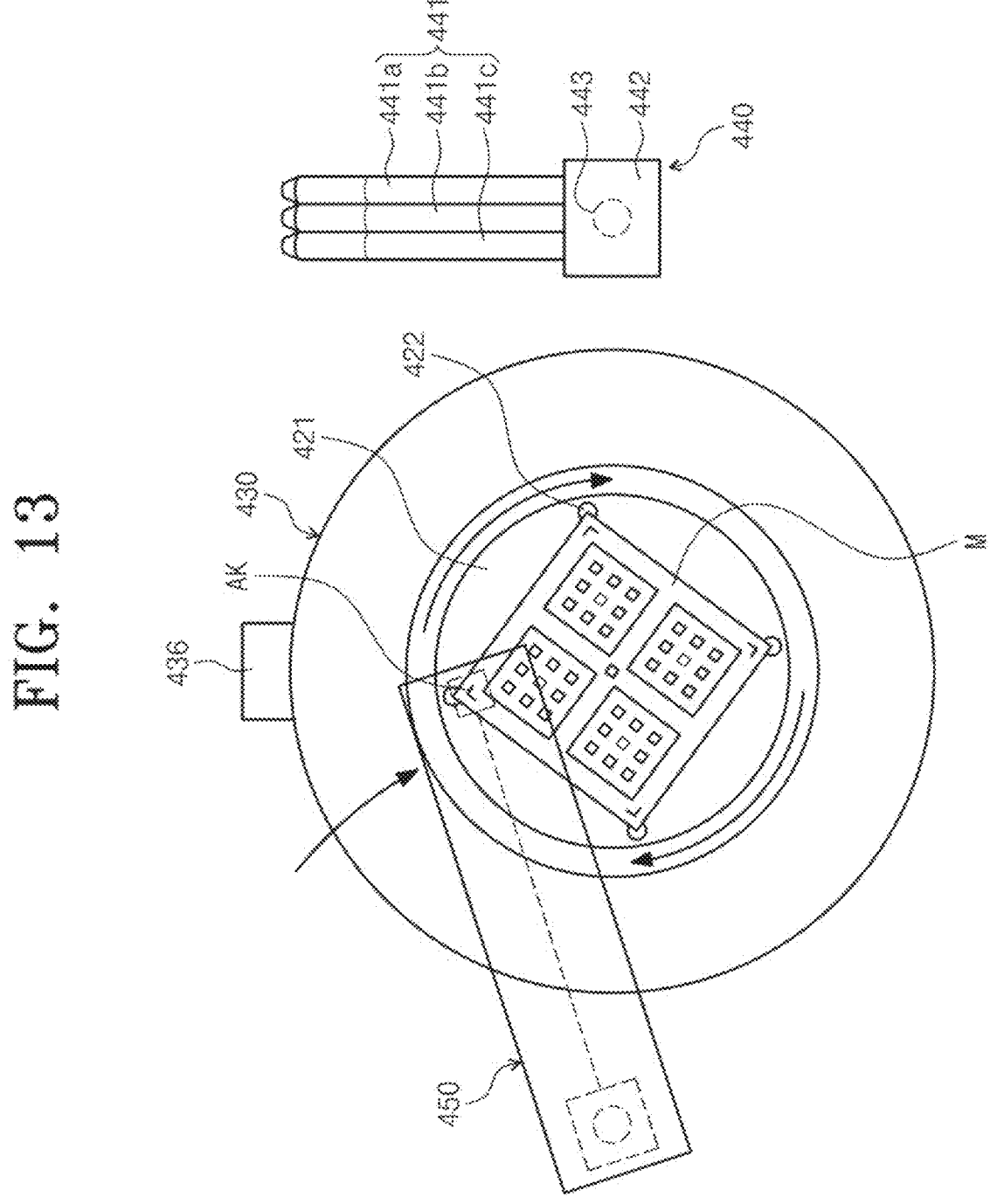
FIG. 13 is a diagram illustrating a state of a substrate treating apparatus performing a location information acquiring operation of FIG. 11.

FIG. 13 is a diagram illustrating a state of the substrate treating apparatus performing the location information acquiring operation of FIG. 11. Referring to FIG. 13, the location information acquiring operation S30 may be performed by moving the irradiation end 4535 of the irradiating module 450 between a standby position and a process position at which the substrate M is heated by irradiating the laser light L to the substrate, and rotating, by the support unit 20, the substrate M in one direction. When the irradiation end 4535 is moved and the substrate M rotates in one direction, at a specific time point, the irradiation end 4535 and the reference mark AK may coincide with each other as illustrated in FIG. 13. In this case, the photographing unit 4540 may acquire a photo and/or image data for the reference mark AK. The controller 30 may obtain a coordinate value for the reference mark AK through the photo and/or image data obtained by the photographing unit 4540.

In addition, in the controller 30 the left and right widths of the substrate M, coordinate data for the center point of the substrate M, coordinate data for the positions of the first pattern P1, the second pattern P2, and the exposure pattern EP in the substrate M may be stored in advance. The controller 30 may acquire location information about the center point of the substrate M, the first pattern P1, and the second pattern P2 based on the obtained coordinate value for the reference mark AK, and the previously stored data.

In the etching operation S40, an etching process may be performed on the pattern formed on the substrate M. In the etching operation S40, the pattern formed on the substrate M may be etched so that a critical dimension width of the first pattern P1 and a critical dimension of the second pattern P2 coincide with each other. For example, the etching operation S40 may be a critical dimension correction process for correcting a difference between the critical dimensions of the first pattern P1 and the second pattern P2. The etching operation S40 may include a liquid treating operation S41, a liquid film inspection operation S44, and a heating operation S42.

Figure 14:
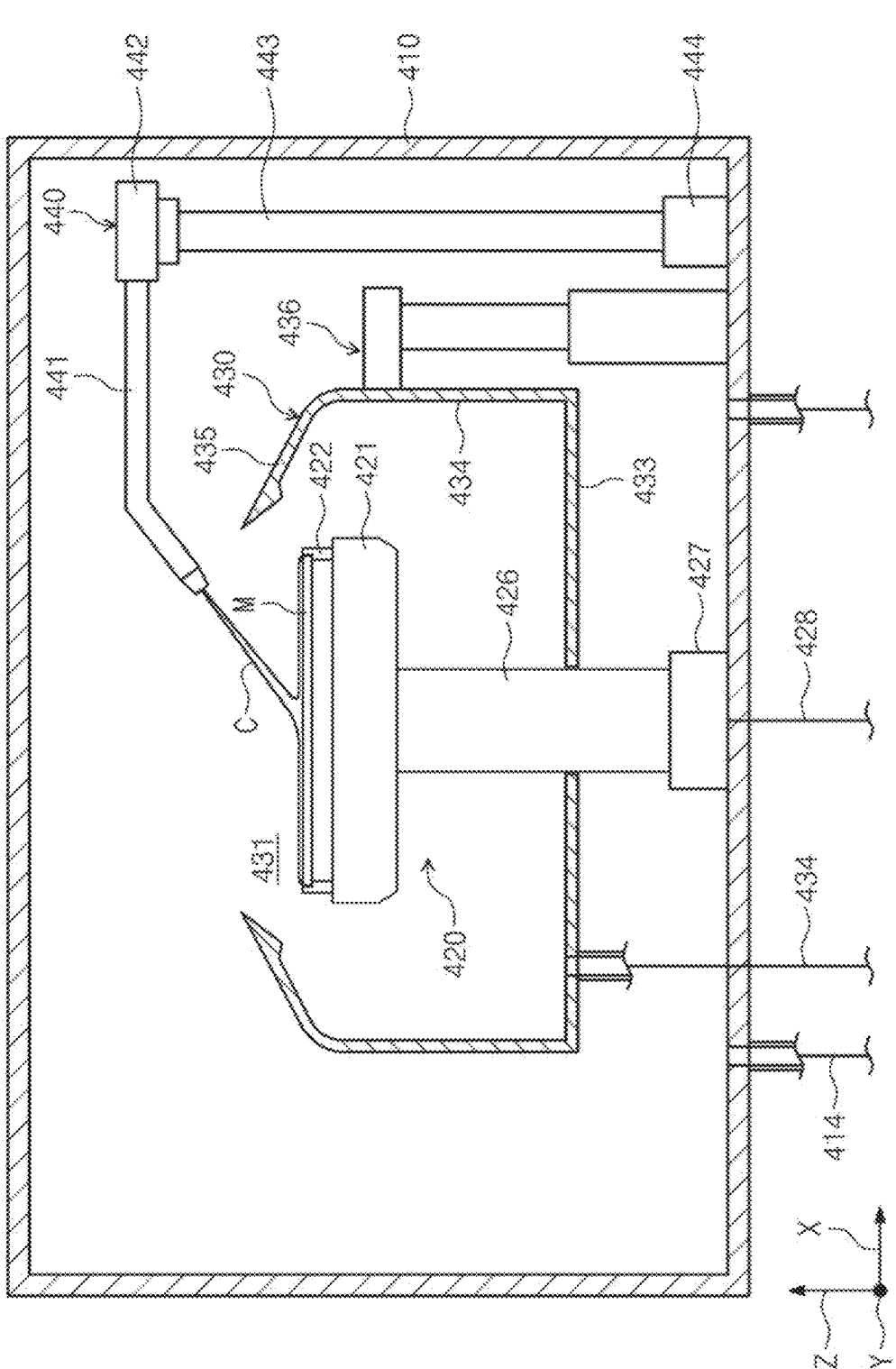
FIG. 14 is a diagram illustrating a state of the substrate treating apparatus performing a liquid treating operation of FIG. 11.

FIG. 14 is a diagram illustrating a state of the substrate treating apparatus performing a liquid treating operation of FIG. 11. Referring to FIG. 14, the liquid treating operation S41 may be an operation in which the liquid supply unit 440 supplies a chemical C that is an etchant to the substrate M. In the liquid treating operation S41, the support unit 420 may not rotate the substrate M. This is to minimize the displacement of the substrate M in order to accurately irradiate the laser light L to the specific region A where the second pattern P2 is formed in the heating operation S42 to be described later.

The amount of the chemical C supplied in the liquid treating operation S41 may be supplied in an amount capable of forming a puddle of the chemical C supplied on the substrate M. For example, the chemical C supplied in the liquid treating operation S41 covers the entire upper surface of the substrate M, and the chemical C may be supplied in the amount that does not flow down from the substrate M, or even if the chemical flows out, the amount of flowing chemical is insignificant. If necessary, the nozzle 441 may supply the chemical C to the entire upper surface of the substrate M while changing the position thereof.

In the above-described exemplary embodiment, the present invention has been described that the chemical C is supplied on the substrate M without rotating the substrate M in the liquid treating operation S41 as an example, but the present invention is not limited thereto. For example, the chemical C may be supplied onto the substrate M while rotating the substrate M even in the liquid treating operation S41.

Figure 15:
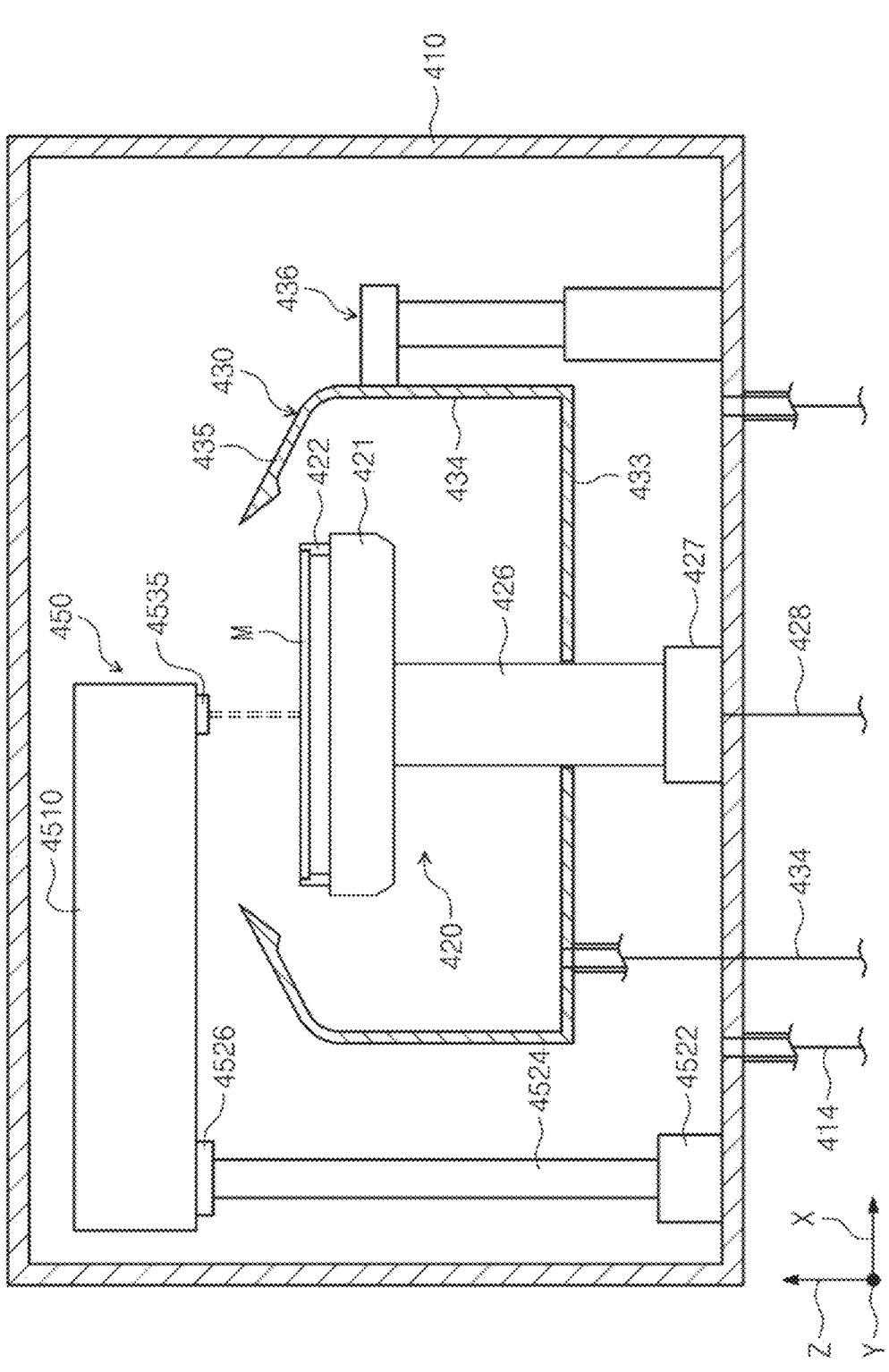
FIG. 15 is a diagram illustrating a state of the substrate treating apparatus performing a heating operation of FIG. 11.

FIG. 15 is a diagram illustrating a state of the substrate treating apparatus performing the heating operation of FIG. 11. Referring to FIG. 15, in the heating operation S42, the substrate M may be heated by irradiating the laser light L to the substrate M. For example, in the heating operation S42, the irradiating module 450 may heat the substrate M by irradiating the laser light L onto the substrate M on which a liquid film is formed. In the heating operation S42, the laser light L may be irradiated to the specific region A of the substrate M. For example, in the heating operation S42, the laser light L may be irradiated to the second pattern P2 formed in the specific region A of the substrate M. The temperature of the specific region A of the substrate M to which the laser light L is irradiated may increase. Accordingly, the degree of etching by the chemical C on the second pattern P2 of the region irradiated with the laser light L may increase.

In the heating operation S42, the laser light L may be irradiated to any one of the first pattern P1 and the second pattern P2. For example, the laser light L may be irradiated to only the second pattern P2 between the first pattern P1 and the second pattern P2. Accordingly, the etching ability of the chemical C for the second pattern P2 is improved. The critical dimension of the first pattern P1 may be changed from the first width (for example, 69 nm) to the target critical dimension (for example, 70 nm). Further, the critical dimension of the second pattern P2 may be changed from the second width (for example, 68.5 nm) to the target critical dimension (for example, 70 nm). That is, by improving the etching ability for the partial region of the substrate M, it is possible to minimize the deviation of the critical dimension of the pattern formed on the substrate M.

Hereinafter, a mechanism for calculating the diameter D of the laser light L according to the exemplary embodiment of the present invention will be described in detail. As described above, the diameter D of the laser light L irradiated from the laser irradiation unit 4531 according to the exemplary embodiment of the present invention may be adjusted by the beam expander 4532. For example, the diameter D of the laser light L may be adjusted in the beam expander 4532 so as to have a size previously stored in the controller 30.

The laser light L is irradiated to the substrate M. The laser light L may be irradiated to the specific region A on the substrate M. The specific region A existing on the substrate M may be defined as a region in which the cell CE is not formed. The specific region A may mean a region outside of the plurality of cells CE. The second pattern P2 may be formed in the specific region A as described above. For example, the plurality of second patterns P2 may be arranged a combination of a serial arrangement and/or a parallel arrangement in the specific region A. Hereinafter, for convenience of description, the present invention will be described based on a case in which the plurality of second patterns P2 is arranged in a series combination in the specific region A as an example.

Figure 16:
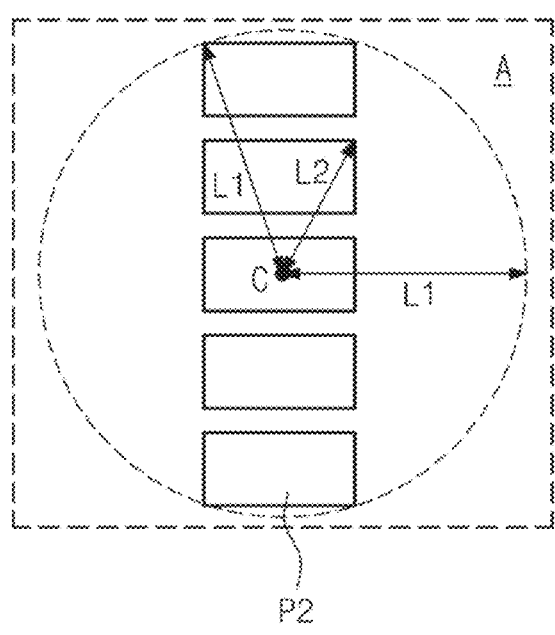
FIG. 16 is a diagram schematically illustrating a state in which a maximum radius of laser light irradiated to a second pattern in the heating operation of FIG. 11 is calculated.

FIG. 16 is a diagram schematically illustrating a state in which a maximum radius of laser light irradiated to the second pattern in the heating operation of FIG. 11 is calculated.

Referring to FIG. 16, the minimum radius LR of the laser light L irradiated from the irradiation end 4535 to the specific region A of the substrate M according to the exemplary embodiment of the present invention is provided in a length that may accommodate all of the specific region A. For example, the minimum radius LR of the laser light L irradiated to the specific region A may be provided to have a length that can cover the entire specific region A when viewed from the top.

According to the exemplary embodiment, the minimum radius LR of the laser light L irradiated to the specific region A may be calculated as the maximum distance among the distances between the center of the second pattern P2 formed in the specific region A and the edges of the second pattern P2. The minimum radius LR of the laser light L may be calculated with the maximum distance among the distances between the center C of the plurality of second patterns P2 formed in the specific region A to the corners of the plurality of second patterns P2. For example, as illustrated in FIG. 16, the first length L1 that is the maximum distance between the first length L1 from the center C of the plurality of second patterns P2 to the corner of the second pattern P2 located at the uppermost end and the second lengths L2 from the center C of the plurality of second patterns P2 to the corner of the second pattern P2 located below the uppermost end may be calculated as the minimum radius LR of the laser light L.

Figure 17:
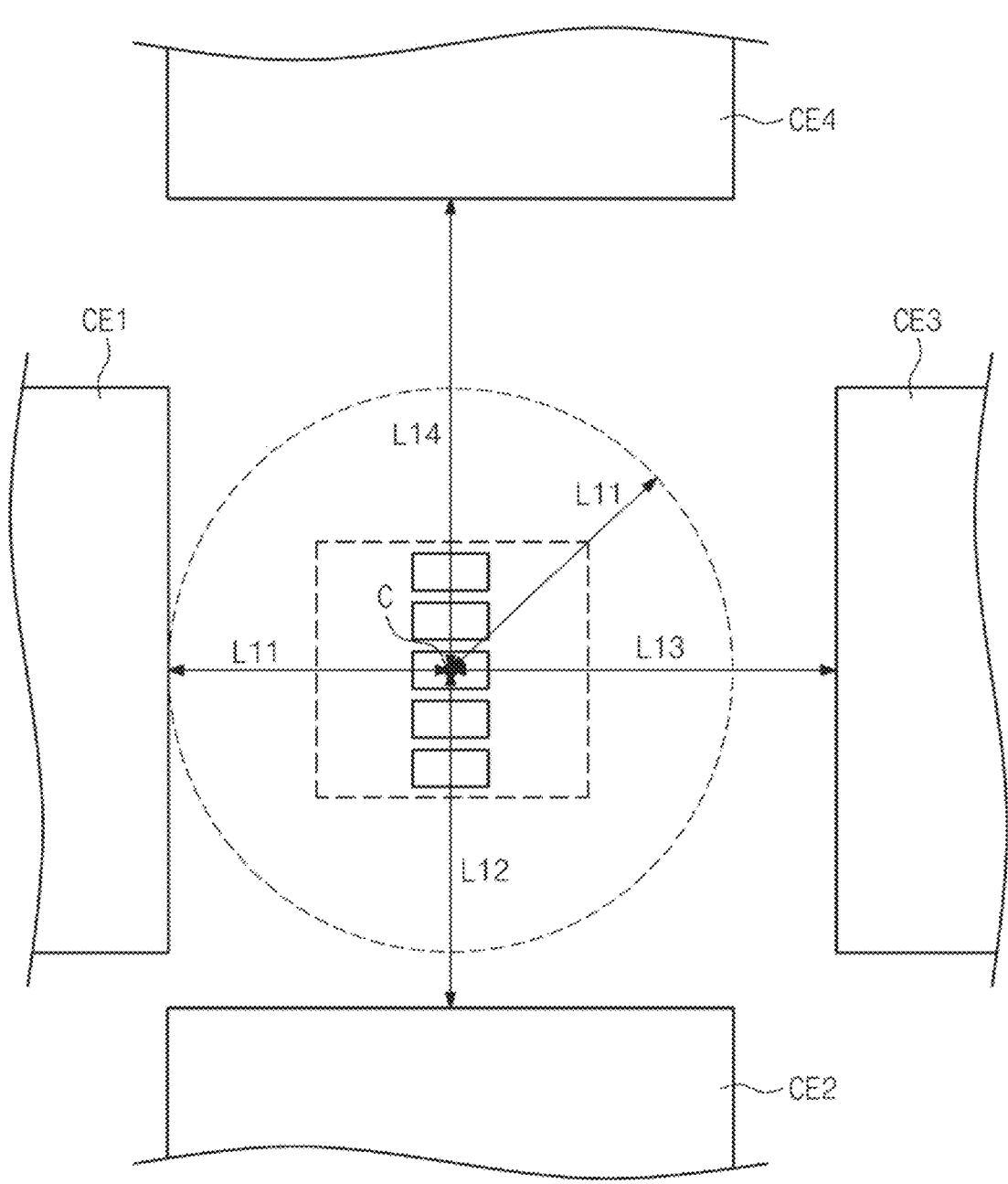
FIG. 17 is a diagram schematically illustrating a state in which a minimum radius of laser light irradiated to the second pattern in the heating operation of FIG. 11 is calculated.

FIG. 17 is a diagram schematically illustrating a state in which the minimum radius of laser light irradiated to the second pattern in the heating operation of FIG. 11 is calculated.

Referring to FIG. 17, the maximum radius RR of the laser light L irradiated from the irradiation end 4535 to the specific region A of the substrate M according to the exemplary embodiment of the present invention is provided with a length that does not interfere with the cells CE formed on the substrate M. For example, when viewed from the top, the maximum radius RR of the laser light L irradiated to the specific region A may be calculated with the shortest distance among the distances from the edges of the cells CE located adjacent to the specific region A among the plurality of cells CE o the center C of the second pattern P2 formed in the specific region A.

For example, as illustrated in FIG. 17, the plurality of cells CE formed on the substrate M may include a first cell CE1, a second cell CE2, a third cell CE3, and a fourth cell CE4 in a counterclockwise direction from the left side from the specific region A with respect to the specific region A. The shortest distances from the center C of the plurality of second patterns P2 formed in the specific region A to the edges of the first cell CE1, the second cell CE2, the third cell CE3, and the fourth cell CE4 may be a first distance L11, a second distance L12, a third distance L13, and a fourth distance L14, respectively. When it is assumed that the first distance L11 is smaller than the second distance L12, the second distance L12 is smaller than the third distance L13, and the third distance L13 is smaller than the fourth distance L14, the maximum radius RR of the laser light L irradiated to the second pattern P2 disposed in the specific region A may have a length corresponding to the first distance L11. That is, the maximum radius RR of the laser light L may be calculated with the shortest distance among the distances from the edges of the cells CE positioned adjacent to the specific region A to the center of the second pattern P2 disposed in the specific region A.

Figure 18:
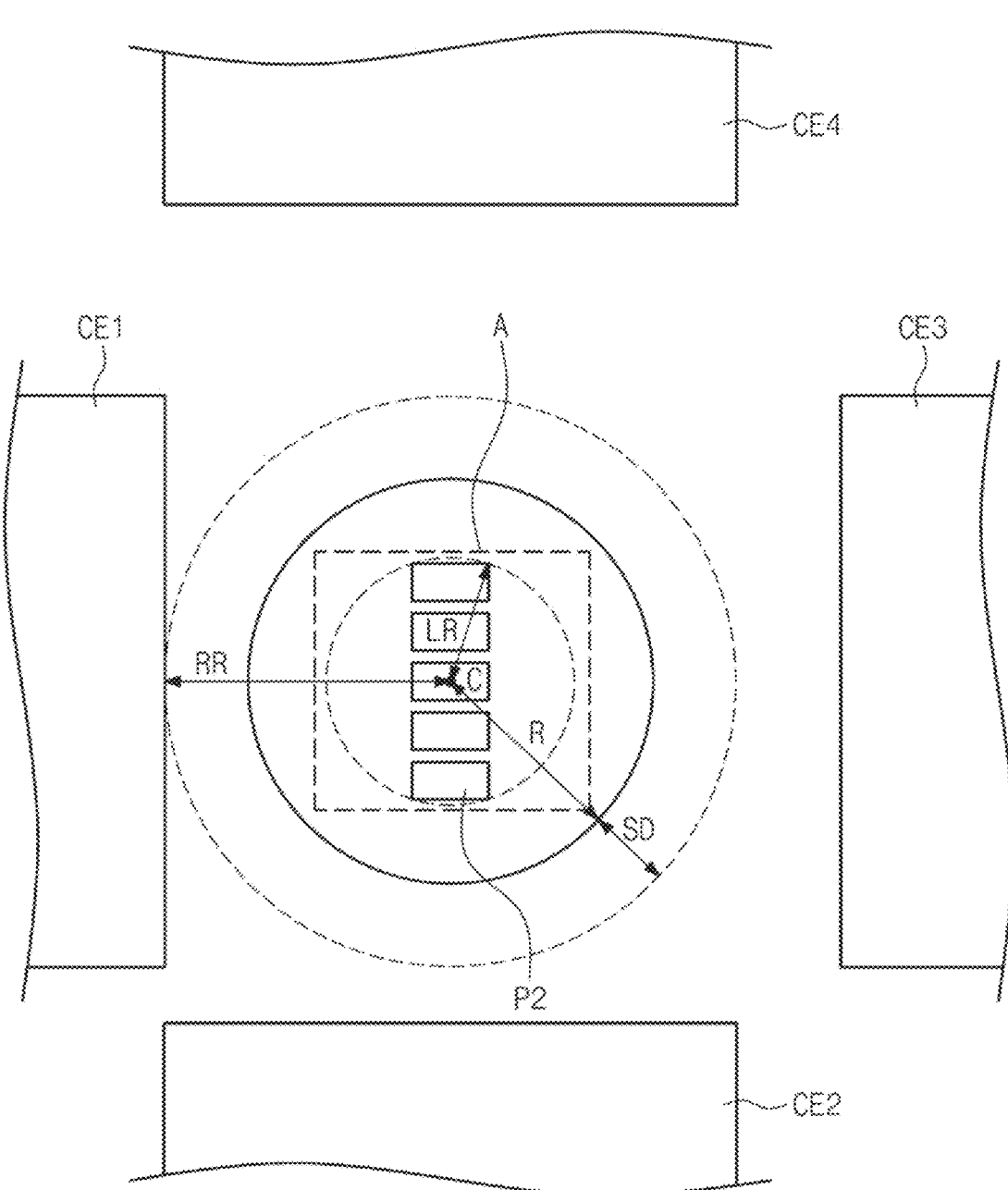
FIG. 18 is a diagram illustrating the laser light irradiated to the second pattern in the heating operation of FIG. 11 viewed from the top.
Figure 19:
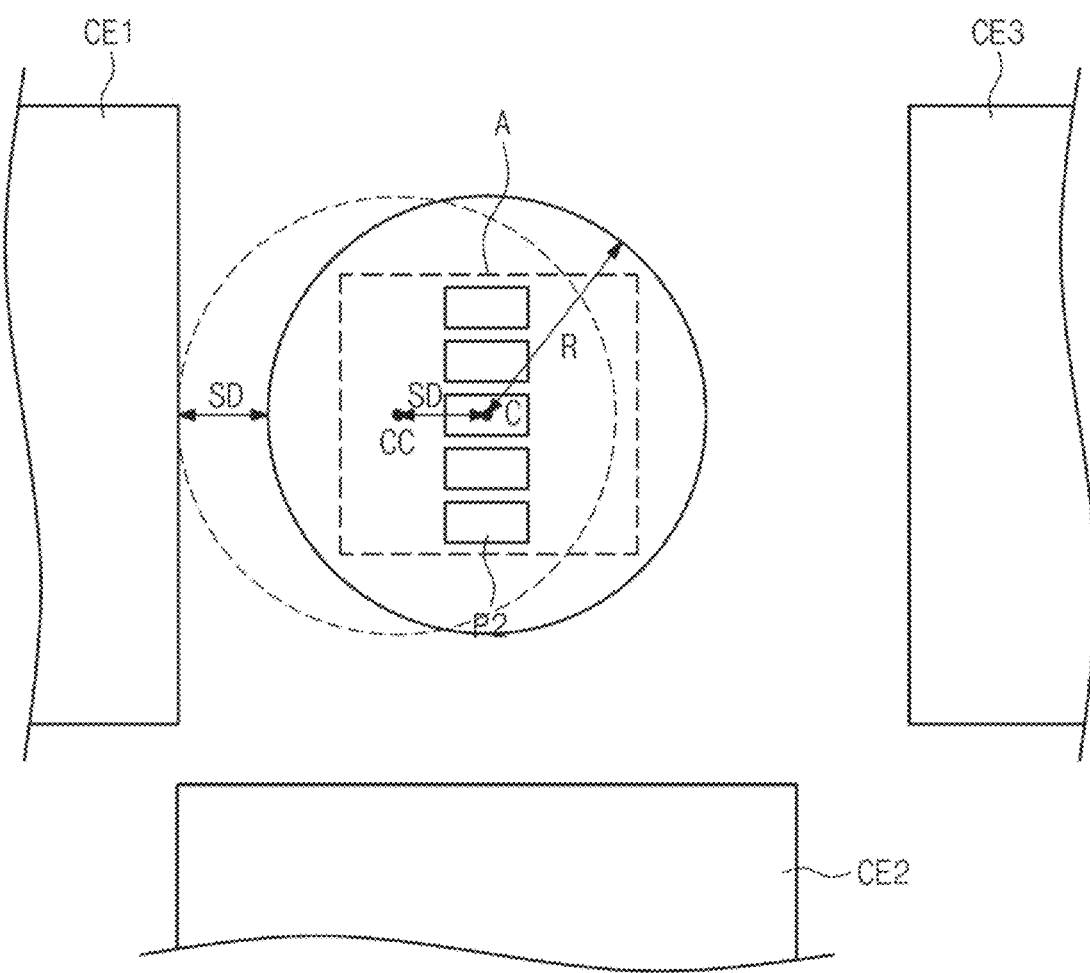
FIG. 19 is a diagram schematically illustrating a state when the laser light irradiated to the second pattern in the heating operation of FIG. 11 is deviated from an irradiation position by an allowable error distance error.

FIG. 18 is a diagram illustrating the laser light irradiated to the second pattern in the heating operation of FIG. 11 viewed from the top. FIG. 19 is a diagram schematically illustrating a state when the laser light irradiated to the second pattern in the heating operation of FIG. 11 is deviated from an irradiation position by an allowable error distance.

Referring to FIGS. 18 and 19, the radius R of the laser light L irradiated with the second pattern P2 disposed in the specific region A according to the exemplary embodiment is defined as a value obtained by subtracting an allowable error distance SD from the maximum radius RR of the laser light L described with reference to FIG. 17. Further, the diameter D of the laser light L is defined as twice the radius R of the laser light L. The allowable error distance SD is defined as a value of a half of the value obtained by subtracting the minimum radius LR of the laser light L described with reference to FIG. 16 from the maximum radius RR. The allowable error distance SD refers to a distance at which the laser light L is irradiated to the entire area of the specific region A when a control error occurs in the laser unit 4530.

The irradiation end 4535 heats the specific region A at the irradiation position. The irradiation end 4535 may irradiate the laser light L to the second pattern P2 disposed in the specific region A at the irradiation position. For example, when the irradiation end 4535 is positioned at the irradiation position, the center CC of the laser light L may coincide with the center C of the second pattern P2 when viewed from the top.

The control error occurs in the laser unit 4530, so that the center CC of the laser light L irradiated from the irradiation end 4535 may not coincide with the center C of the second pattern P2 disposed in the specific region A. For example, as illustrated in FIG. 19, when the laser unit 4530 irradiates the laser light L to the substrate M at the irradiation position, the center CC of the laser light L may be located at a position spaced apart from the center C of the second pattern P2 by a predetermined distance. In this case, when the distance between the center CC of the laser light L and the center C of the second pattern P2 is within the allowable error distance SD, the laser light L irradiated from the irradiation end 4535 to the specific region A may cover the entire area of the specific region A. Accordingly, even when the control error occurs in the laser unit 4530, all of the second patterns P2 disposed in the specific region A may be heated. That is, even when the error control occurs in the laser unit 4530, when the error generation distance is within the allowable error distance SD, the second patterns P2 disposed in the specific region A may be etched collectively.

According to the above-described exemplary embodiment of the present invention, by calculating the minimum radius LR of the laser light L with the maximum distance among the distances between the corners of the second pattern P2 from the center of the second pattern P2, the second pattern P2 formed in the specific region A may be etched collectively.

In addition, by calculating the maximum radius RR of the laser light L with the shortest distance among the distances from the edges of the cells CE positioned adjacent to the specific region A among the plurality of cells CE to the center of the second pattern P2, it is possible to prevent the laser light L from being irradiated to the first pattern P1 formed in the cells CE. It is possible to prevent the laser light L from being irradiated to the first pattern P1 except for the second pattern P2 that is the etch target. Accordingly, the first pattern P1 formed in the cell CE is prevented from being etched by the laser light L, and only the second pattern P2 is selectively heated, so that the correction of the difference in critical dimension between the first pattern P1 and the second pattern may be performed smoothly.

According to the above-described exemplary embodiment of the present invention, even though the control error occurs in the laser unit 4530 and the position to which the laser light L is irradiated is changed from the irradiation position, when the center CC of the laser light L is in the allowable error distance SD from the center C of the second pattern P2 formed in the specific region A, the second pattern P2 formed in the specific region A may be heated collectively. Accordingly, it is possible to maximally secure the allowable error range of the irradiation position of the laser light L irradiated by the laser unit 4530.

Figure 20:
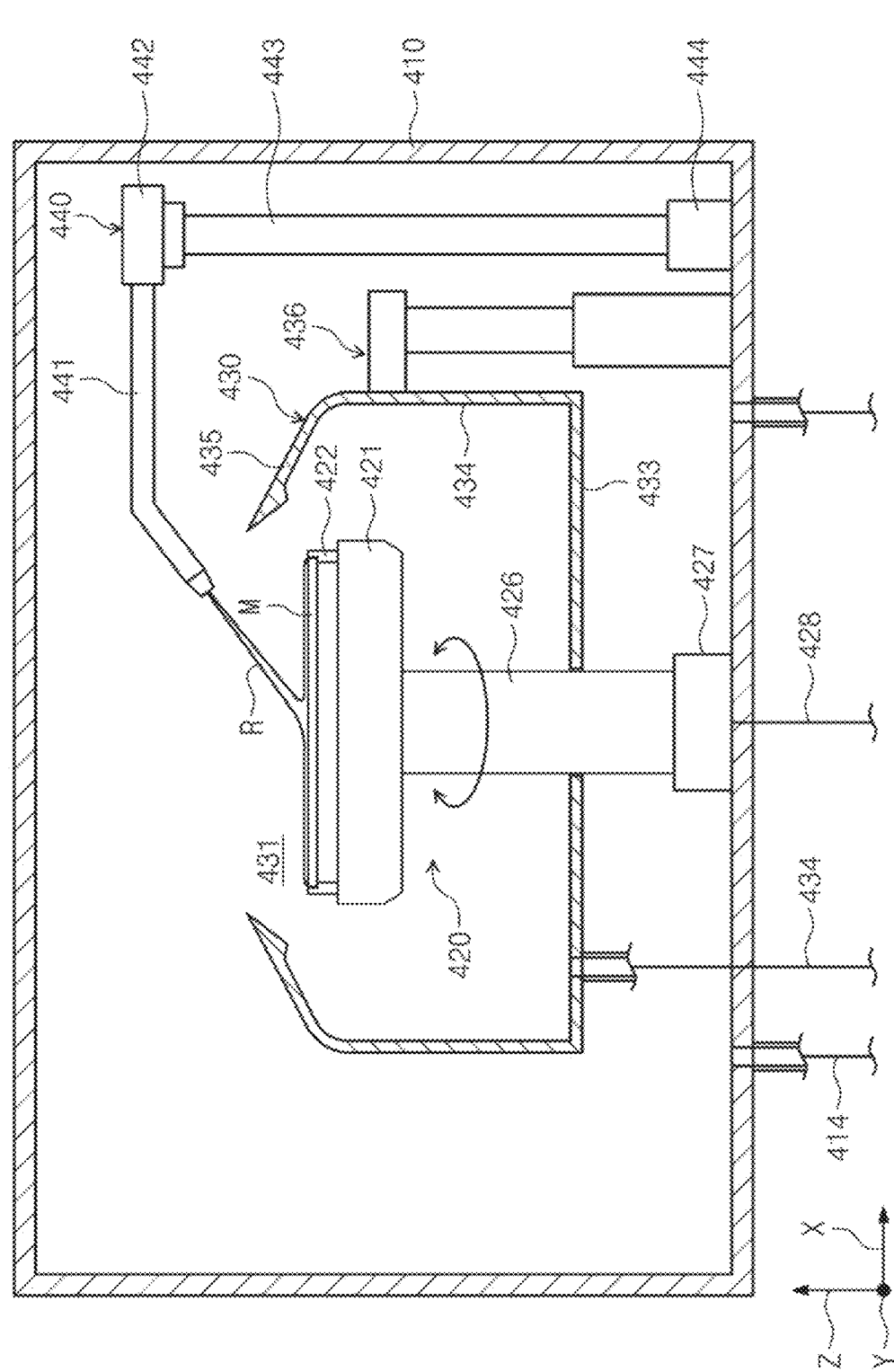
FIG. 20 is a diagram illustrating a state of the substrate treating apparatus performing a rinsing operation of FIG. 11.

FIG. 20 is a diagram illustrating a state of the substrate treating apparatus performing the rinsing operation of FIG. 11. Referring to FIG. 20, in the rinsing operation S50, process by-products generated in the etching operation S40 are removed from the substrate M. In the rinsing operation S50, a rinse liquid R may be supplied to the rotating substrate M. The process by-products formed on the substrate M may be removed by supplying the rinse liquid R to the substrate M. In addition, if necessary, the support unit 420 may remove the rinse liquid R remaining on the substrate M by rotating the substrate M at high speed in order to dry the rinse liquid R remaining on the substrate M.

In the substrate unloading operation S60, the substrate M on which the treatment has been completed may be unloaded from the internal space 412. In the substrate unloading operation S60, a door (not illustrated) may open a loading/unloading port (not illustrated) formed in the housing 410. In addition, in the substrate unloading operation S60, the transfer robot 320 may unload the substrate M from the support unit 420, and unload the unloaded substrate M from the internal space 412.

In the above-described exemplary embodiment of the present invention, the present invention has been described based on the case where the etch rate of the second pattern P2 is improved in the substrate M having the first pattern P1 that is the monitoring pattern for monitoring the exposure pattern and the second pattern P2 that is the pattern for setting conditions for treating the substrate as an example. However, unlike this, the functions of the first pattern P1 and the second pattern P2 may be different from those of the above-described exemplary embodiment of the present invention. In addition, according to the exemplary embodiment of the present invention, only one of the first pattern P1 and the second pattern P2 is provided, and an etch rate of the one pattern provided between the first pattern P1 and the second pattern P2 may be improved. In addition, according to the exemplary embodiment of the present invention, the same may be applied to improve an etch rate of a specific region in a substrate, such as a wafer or glass, other than a photomask.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment.

Further, the accompanying claims should be construed to include other exemplary embodiments as well.

What is claimed is:

1. A substrate treating-method of treating a substrate including a plurality of cells, the substrate treating method comprising:

supplying a treatment liquid to the substrate;

heating the substrate while supplying the treatment liquid and irradiating laser light via a flat-top to a first region located outside a second region, the plurality of cells being in the second region, wherein the laser light is formed to cover the first region when viewed from an overhead perspective; and forming a first pattern and at least one second pattern on the substrate, the first pattern and the at least one second pattern being different, the first pattern being in the plurality of cells, the at least one second pattern being in the first region.

2. The method of claim 1, wherein the heating heats such that a maximum radius of the laser light has a shortest distance among distances from edges of the cells located adjacent to the first region among the plurality of cells to a center of the at least one second pattern.

3. The method of claim 2, wherein the heating heats such that a minimum radius of the laser light has a maximum distance among distances between the center of the at least one second pattern to corners of the at least one second pattern.

4. The method of claim 3, wherein the heating heats such that a radius of the laser light irradiated to the at least one second pattern has a value obtained by subtracting an allowable error distance from the maximum radius, and the allowable error distance is determined with a half of a value obtained by subtracting the minimum radius from the maximum radius.

5. The method of claim 4, wherein the heating heats such that a center of the laser light irradiated to the at least one second pattern is movable from the center of the at least one second pattern to the allowable error distance.

6. The method of claim 1, wherein the at least one second pattern includes a plurality of second patterns, and the plurality of second patterns are formed in a combination of a serial arrangement and/or a parallel arrangement.

* * * * *